(12) United States Patent
Sung et al.

(10) Patent No.: US 9,305,801 B2
(45) Date of Patent: Apr. 5, 2016

(54) METHODS FOR FORMING A SEMICONDUCTOR DEVICE USING MASKS WITH NON-METALLIC PORTIONS

(71) Applicants: Sughyun Sung, Yongin-si (KR); Myeongcheol Kim, Suwon-si (KR); Myung-Hoon Jung, Suwon-si (KR)

(72) Inventors: Sughyun Sung, Yongin-si (KR); Myeongcheol Kim, Suwon-si (KR); Myung-Hoon Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 112 days.

(21) Appl. No.: 13/789,244

(22) Filed: Mar. 7, 2013

(65) Prior Publication Data

US 2013/0309853 A1 Nov. 21, 2013

(30) Foreign Application Priority Data

May 16, 2012 (KR) ........................ 10-2012-0051828

(51) Int. Cl.
| | |
|---|---|
| *H01L 21/308* | (2006.01) |
| *H01L 21/033* | (2006.01) |
| *H01L 21/311* | (2006.01) |
| *H01L 27/11* | (2006.01) |
| *H01L 21/768* | (2006.01) |

(52) U.S. Cl.
CPC ........ *H01L 21/3088* (2013.01); *H01L 21/0332* (2013.01); *H01L 21/31144* (2013.01); *H01L 21/76816* (2013.01); *H01L 21/76897* (2013.01); *H01L 27/1104* (2013.01)

(58) Field of Classification Search
CPC ..................... H01L 21/3088; H01L 21/76816; H01L 21/3144; H01L 21/0332
USPC .................................................. 438/700–702
See application file for complete search history.

(56) References Cited

U.S. PATENT DOCUMENTS

| | | | | |
|---|---|---|---|---|
| 5,962,347 | A | * 10/1999 | Tokunaga et al. ............. | 438/728 |
| 7,749,902 | B2 | 7/2010 | Kim et al. | |
| 2005/0085086 | A1 | * 4/2005 | Kanzawa ...................... | 438/706 |
| 2010/0173492 | A1 | 7/2010 | Kim et al. | |
| 2010/0221919 | A1 | 9/2010 | Lee et al. | |
| 2010/0248491 | A1 | 9/2010 | Sun et al. | |
| 2010/0327413 | A1 | 12/2010 | Lee et al. | |
| 2011/0236833 | A1 | 9/2011 | Chan | |
| 2011/0312184 | A1 | 12/2011 | Lee et al. | |
| 2011/0318931 | A1 | 12/2011 | Min et al. | |
| 2012/0040528 | A1 | * 2/2012 | Kim et al. ..................... | 438/675 |
| 2012/0045901 | A1 | 2/2012 | Kim et al. | |
| 2012/0049377 | A1 | 3/2012 | Yang et al. | |
| 2012/0142179 | A1 | 6/2012 | Park et al. | |
| 2012/0289019 | A1 | * 11/2012 | Im et al. ........................ | 438/381 |

FOREIGN PATENT DOCUMENTS

| | | |
|---|---|---|
| KR | 10-2012-0021722 A | 3/2012 |
| KR | 10-2012-0060667 A | 6/2012 |

* cited by examiner

*Primary Examiner* — Thanhha Pham
(74) *Attorney, Agent, or Firm* — Myers Bigel & Sibley, P.A.

(57) ABSTRACT

A method of forming a semiconductor device can be provided by forming a mask pattern including non-metallic first spaced-apart portions that extend in a first direction on a lower target layer and non-metallic second spaced-apart portions that extend in a second direction on the lower target layer to cross-over the non-metallic first spaced-apart portions at locations. The lower target layer can be etched using the mask pattern.

33 Claims, 29 Drawing Sheets

METHODS FOR FORMING A SEMICONDUCTOR DEVICE USING MASKS WITH NON-METALLIC PORTIONS

CROSS-REFERENCE TO RELATED APPLICATIONS

This U.S. non-provisional patent application claims priority under 35 U.S.C. §119 to Korean Patent Application No. 10-2012-0051828, filed on May 16, 2012, the entirety of which is incorporated by reference herein.

BACKGROUND

The inventive concept relates to methods for manufacturing a semiconductor device and, more particularly, to methods for manufacturing a semiconductor device using a double patterning technology.

Semiconductor devices are widely used in the electronics industry because of their small size, multi-functionality, and/or low manufacturing costs. Semiconductor devices can be categorized, for examples, as memory devices storing data, logic devices processing data, and hybrid devices having both the function of memory devices and the function of logic devices.

As the electronics industry has advanced, patterns in semiconductor devices have become increasingly smaller due to their increasing integration density. Decreasing the pattern size (line width) of semiconductor devices has made it more difficult to realize semiconductor devices having high operating speeds and/or excellent reliability.

SUMMARY

Embodiments according to the invention can provide methods of forming semiconductor devices using marks with non-metallic portions. Pursuant to these embodiments, a method of forming a semiconductor device can be provided by forming a mask pattern including non-metallic first spaced-apart portions that extend in a first direction on a lower target layer and non-metallic second spaced-apart portions that extend in a second direction on the lower target layer to cross-over the non-metallic first spaced-apart portions at locations, The lower target layer can be etched using the mask pattern.

In some embodiments according to the invention, etching the lower target layer can further include removing an upper portion of the non-metallic second spaced-apart portions of the mask pattern when etching the lower target layer. In some embodiments according to the invention, the non-metallic first and second spaced-apart portions are free of metals. In some embodiments according to the invention, the non-metallic first and second spaced-apart portions can include a respective non-metallic first and second spaced-apart line-shaped portions.

In some embodiments according to the invention, forming the mask pattern can include forming a first hard mask layer and a non-metallic buffer pattern thereon extending in the second direction on the lower target layer and forming a hard mask pattern extending in the first direction on the first hard mask layer and on the non-metallic buffer pattern.

In some embodiments according to the invention, forming the hard mask pattern can include forming the hard mask pattern to include portions covering an isolation region beneath the lower target layer and extending between directly adjacent portions of the non-metallic buffer pattern. In some embodiments according to the invention, the first hard mask layer and the non-metallic buffer pattern have an etch selectivity relative to the hard mask pattern.

In some embodiments according to the invention, forming the first hard mask layer can include forming an inorganic mask layer on an organic mask layer, where the method can further include etching the first hard mask layer using the hard mask pattern to remove portions of the inorganic mask layer exposed by the hard mask pattern to expose the organic mask layer and to leave an inorganic mask pattern beneath the non-metallic buffer pattern and beneath the hard mask pattern. The hard mask pattern can be removed from the non-metallic buffer pattern and from the inorganic mask pattern.

In some embodiments according to the invention, the method can further include etching exposed portions of the organic mask layer using the non-metallic buffer pattern and the inorganic mask pattern to expose underlying portions of the lower target layer to form the non-metallic first and second spaced-apart portions of the mask pattern. In some embodiments according to the invention, the second spaced-apart portions of the mask pattern comprise the non-metallic buffer pattern. In some embodiments according to the invention, etching the lower target layer can include anisotropically etching the lower target layer using the inorganic mask pattern, the underlying organic mask layer, and the non-metallic buffer pattern. In some embodiments according to the invention, the method can further include removing the mask pattern from the lower target layer.

In some embodiments according to the invention, the method can further include forming filling material on the exposed portions of the lower target layer. In some embodiments according to the invention, the non-metallic first spaced-apart portions are spaced-apart by a first distance and the non-metallic second spaced-apart portions are spaced-apart by a second distance that is different than the first distance. In some embodiments according to the invention, the second distance varies across the lower target layer.

In some embodiments according to the invention, the non-metallic first spaced-apart portions are spaced-apart by a first distance and the non-metallic second spaced-apart portions are spaced-apart by a second distance that is equal to the first distance. In some embodiments according to the invention, the semiconductor device comprises a Static Random Access Memory (SRAM). In some embodiments according to the invention, the method can further include forming gate electrodes prior to forming the mask pattern, wherein etching lower target layer exposes active areas beneath the lower target layer associated with the gate electrodes.

In some embodiments according to the invention, the non-metallic first spaced-apart portions and the non-metallic second spaced-apart portions can include non-metallic first spaced-apart lines and non-metallic second spaced-apart lines, respectively, that extend in the first and second directions, perpendicular to one another.

A method of forming a semiconductor device can be provided by etching a lower target layer, using a multi-level mask mesh pattern that is free of metals, to expose active areas of a substrate adjacent to metal gate structures associated with the active regions.

A method of forming a semiconductor device can be provided by forming a gate structure including a metal in a dielectric layer on a substrate, where the gate structure associated with a target structure in the substrate. A non-metallic mask pattern can be formed on the dielectric layer, the non-metallic mask pattern. The dielectric layer can be etched using the non-metallic mask pattern to expose the target structure.

BRIEF DESCRIPTION OF THE DRAWINGS

The inventive concept will become more apparent in view of the attached drawings and accompanying detailed description.

FIGS. 10A through 15A are plan views illustrating methods for manufacturing a semiconductor device according to some embodiments of the inventive concept;

FIGS. 10B through 15B are cross-sectional views taken along lines I-I' of FIGS. 10A through 15A, respectively;

FIGS. 10C through 15C are cross-sectional views taken along lines II-IP of FIGS. 10A through 15A, respectively;

DETAILED DESCRIPTION OF EMBODIMENTS ACCORDING TO THE INVENTIVE CONCEPT

Figure 1:
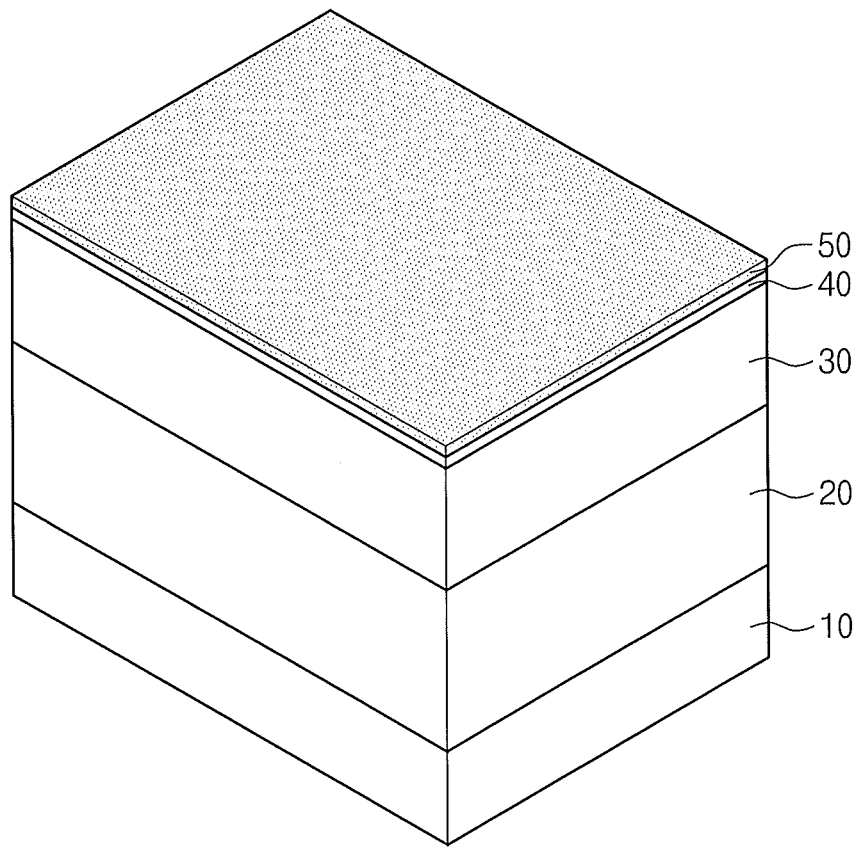
FIGS. 1 through 8 are perspective views illustrating methods for manufacturing a semiconductor device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1 through 8 are perspective views illustrating method for manufacturing a semiconductor device according to some embodiments of the inventive concept. Referring to FIG. 1, a lower target layer 20, a first organic mask layer 30, a first inorganic mask layer 40, and a buffer mask layer 50 are sequentially formed on a substrate 10. The first organic mask layer 30 and the first inorganic mask layer 40 may constitute a first hard mask layer.

The lower target layer 20 may be formed of one of a semiconductor material, a conductive material, an insulating material, or any combination thereof. For example, if the lower target layer 20 is formed of the semiconductor material, the lower target layer 20 may be a portion of the substrate 10 or an epitaxial layer. If the lower target layer 20 is formed of, for example, the conductive material, the lower target layer 20 may be formed of doped poly-silicon, metal silicide, metal, metal nitride, or any combination thereof. For example, if the lower target layer 20 is formed of the insulating material, the lower target layer 20 may be formed of silicon oxide, silicon nitride, silicon oxynitride, or a low-dielectric material. Additionally, the lower target layer 20 may be a single-layer or a stack layer including a plurality of stacked layers. In some embodiments, the lower target layer 20 may include a plurality of stacked insulating layers and a conductive layer or a semiconductor layer disposed between the stacked insulating layers. In some other embodiments, the lower target layer 20 may include at least one of a semiconductor pattern, a conductive pattern, and an insulating pattern.

The first organic mask layer 30 may be formed of a material having an etch selectivity with respect to the lower target layer 20. The first organic mask layer 30 may be formed of a spin-on-hard mask (SOH) layer or an amorphous carbon layer (ACL). The SOH layer may include a carbon-based SOH layer or a silicon-based SOH layer. The first organic mask layer 30 may be a non-photo sensitivity material layer. The first organic mask layer 30 may be formed using a spin-on-coating method.

The first inorganic mask layer 40 may be formed of a material having an etch selectivity with respect to the first organic mask layer 30. For example, the first inorganic mask layer 40 may be formed of a material having an etch selectivity ratio of at least about 1:10 with respect to the first organic mask layer 30 in a subsequent process etching the first organic mask layer 30. In some embodiments, the first inorganic mask layer 40 may be formed of a non-metallic material which does not include a metal (i.e., is free of metals). For example, the first inorganic mask layer 40 may be formed of at least one of silicon-based materials such as a silicon oxide layer, a silicon nitride layer, a silicon oxynitride layer, a silicon carbonitride layer, and a poly-silicon layer.

The buffer mask layer 50 may be formed of a material having an etch selectivity with respect to the first inorganic mask layer 40. For example, the buffer mask layer 50 may be formed of a material having an etch selectivity ratio of at least about 1:10 with respect to the first inorganic mask layer 40 in a subsequent process etching the first inorganic mask layer 40. The buffer mask layer 50 may be formed of a non-metallic material which does not include a metal. For example, the buffer mask layer 50 may be formed of at least one of silicon-based materials such as a silicon oxide layer, a silicon nitride layer, a silicon oxynitride layer, a silicon carbonitride layer, and a poly-silicon layer. The buffer mask layer 50 may be formed of a material that is different from that of the first inorganic mask layer 40.

In some embodiments, if the first inorganic mask layer 40 is formed of a silicon nitride layer and/or a silicon oxynitride layer, the buffer mask layer 50 may be formed of a silicon oxide layer. For example, the buffer mask layer 50 may be formed of at least one of high density plasma (HDP) oxide, tetraethylorthosilicate (TEOS), plasma enhanced tetraethylorthosilicate (PE-TEOS), $O_3$-tetraethylorthosilicate ($O_3$-TEOS), and undoped silicate glass (USG). In some embodiments, if the first inorganic mask layer 40 is formed of a silicon oxide layer, the buffer mask layer 50 may be formed of a silicon nitride layer and/or a silicon oxynitride layer.

Figure 2:
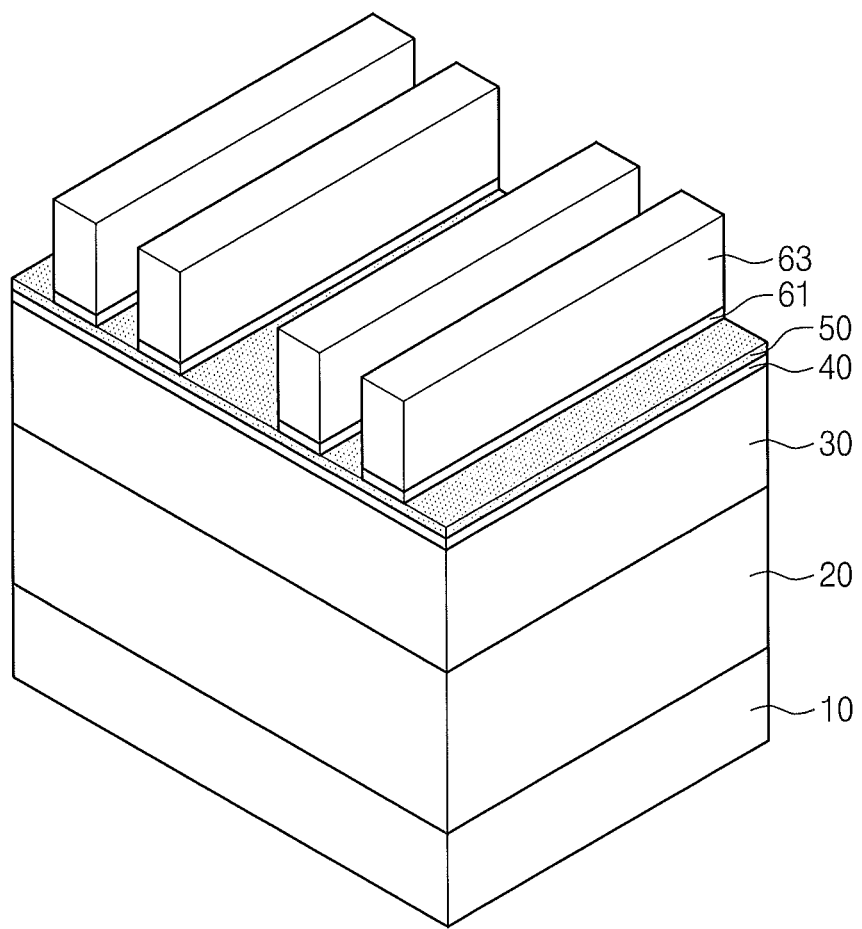

Referring to FIG. 2, photoresist patterns 63 for patterning the buffer mask layer 50 may be formed on the buffer mask layer 50. The photoresist patterns 63 may be line-shaped. The photoresist patterns 63 may be formed by coating a photoresist layer on the buffer mask layer 50, and performing an exposure process and a development process on the photoresist layer. In some embodiments, a photolithography process for forming the line-shaped pattern may be performed on the photoresist layer.

An anti-reflection pattern 61 may be formed between each of the photoresist patterns 63 and the buffer mask layer 50. The anti-reflection pattern 61 may be formed of a material which has an etch selectivity with respect to the buffer mask layer 50 and absorbs light during the exposure process to reduce light-reflection. The anti-reflection pattern 61 may be formed of an organic material or an inorganic material. In some embodiments, the anti-reflection pattern 61 may be formed of a material having etching properties similar to those of a photoresist.

Figure 3:
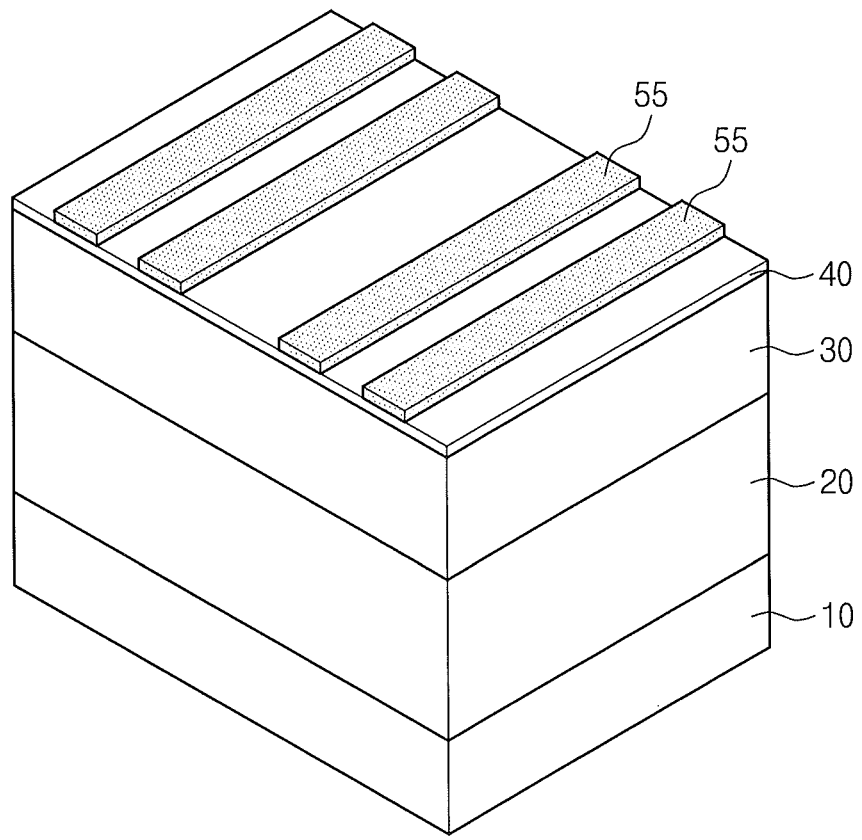

Referring to FIG. 3, the buffer mask layer 50 is etched using the photoresist patterns 63 and the anti-reflection patterns 61. When the buffer mask layer 50 is etched, the first inorganic mask layer 40 may be used as an etch stop layer. Thus, buffer mask patterns 55 may be formed on the first inorganic mask layer 40 and be spaced apart from each other by a predetermined distance. The buffer mask patterns 55 may include elements that are line-shaped and extend parallel to each other.

In some embodiments, widths of the buffer mask patterns 55 may be equal to each other, but the spaces between the buffer mask patterns 55 may be different from each other. In some embodiments, the widths of the buffer mask patterns 55 may be equal to each other and spaces between the buffer mask patterns 55 may be equal to each other.

After the buffer mask patterns 55 are formed, the photoresist patterns 63 and the anti-reflection patterns 61 may be removed by, for example, an ashing process.

Figure 4:
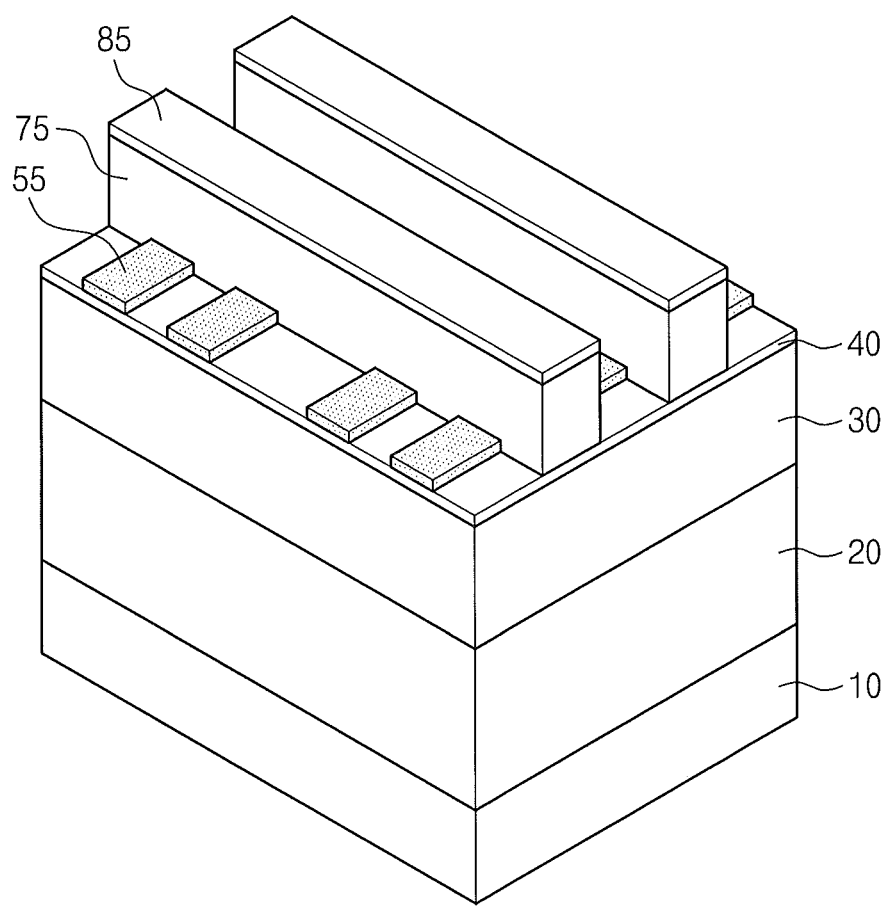

Referring to FIG. 4, second organic mask patterns 75 and second inorganic mask patterns 85 may be formed to cross over the buffer mask patterns 55. The second organic mask patterns 75 and the second inorganic mask patterns 85 sequentially stacked may constitute a second hard mask pattern.

The second organic mask patterns 75 and the second inorganic mask patterns 85 may be formed by sequentially forming a second organic mask layer and a second inorganic mask layer on the first inorganic mask layer 40 on which the buffer mask patterns 55 are formed, forming photoresist patterns crossing over the buffer mask patterns 55, etching the second inorganic mask layer using the photoresist patterns as etch masks to form the second inorganic mask patterns 85, and etching the second organic mask layer using the second inorganic mask patterns 85 as etch masks.

The second organic mask patterns 75 may be formed of a material having an etch selectivity with respect to the buffer mask patterns 55 and the first inorganic mask layer 40. The second organic mask patterns 75 may be formed of the same material as the first organic mask layer 30. For example, the second organic mask patterns 75 may be formed of a spin-on-hard mask (SOH) layer or an amorphous carbon layer (ACL). The SOH layer may include a carbon-based SOH layer or a silicon-based SOH layer. The second organic mask patterns 75 may be a non-photo sensitivity material layer. The second organic mask patterns 75 may be formed using a spin-on-coating method. The etch process etching the above second organic mask layer may use a mixture gas of a fluorine-based etch gas and an oxygen ($O_2$) gas, or a mixture gas of the fluorine-based etch gas, the oxygen ($O_2$) gas, and an argon (Ar) gas. Here, the fluorine-based etch gas may include $C_3F_6$, $C_4F_6$, $C_4F_3$, and/or $C_5F_8$.

The second inorganic mask patterns 85 may be formed of a material having an etch selectivity with respect to the second organic mask patterns 75. The second inorganic mask patterns 85 may include at least one of silicon-containing materials such as SiON, $SiO_2$, $Si_3N_4$, and poly-silicon. In some embodiments, the second inorganic mask patterns 85 may be formed of the same material as the first inorganic mask layer 40.

The second organic mask patterns 75 and the second inorganic mask patterns 85 may expose portions of the buffer mask patterns 55 and portions of the first inorganic mask layer 40.

Figure 5:
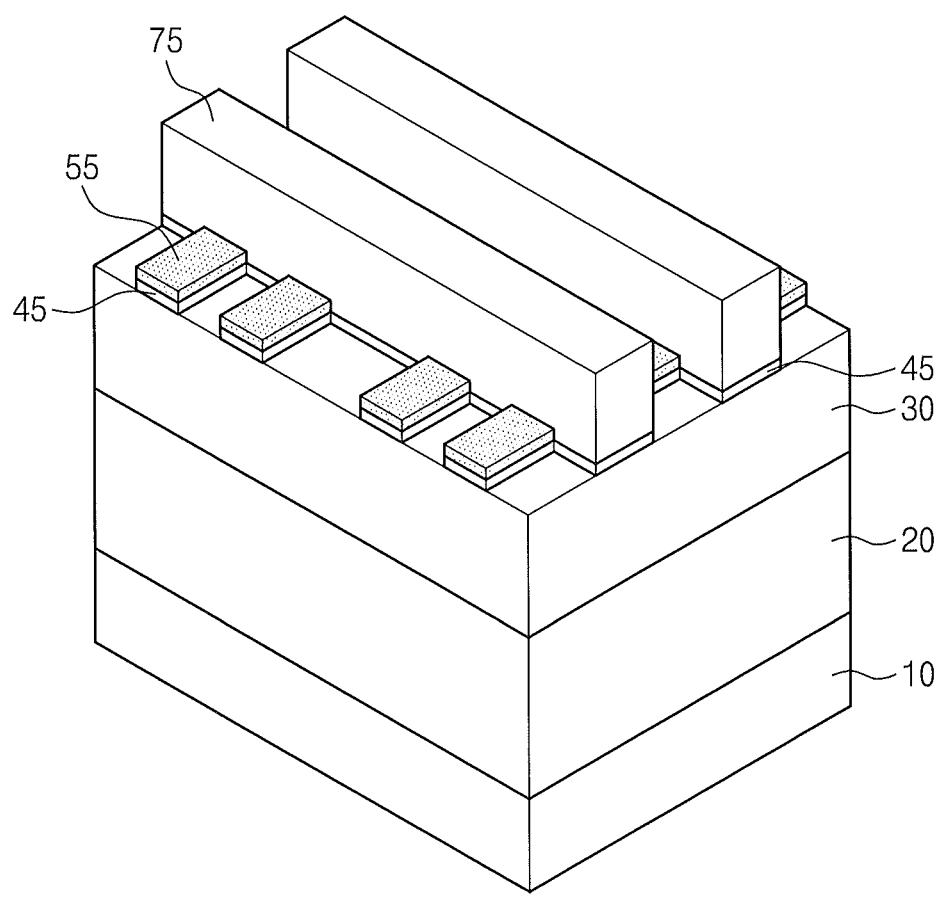

Referring to FIG. 5, the first inorganic mask layer 40 is etched using the buffer mask patterns 55 and the second organic mask patterns 75 as etch masks, such that a first inorganic mask pattern 45 may be formed to expose predetermined regions of the first organic mask layer 30.

Etching the first inorganic mask layer 40 may be performed using an etch gas capable of reducing etch rates of the first organic mask layer 30, the buffer mask patterns 55, and the second organic mask patterns 75 and having a high etch rate with respect to the first inorganic mask layer 40.

The first inorganic mask layer 40 is etched to form the first inorganic mask pattern 45 having two-dimensionally arranged openings. The widths of the openings may be different from each other in predetermined regions.

In some embodiments, if the first inorganic mask layer 40 is formed of the same material as the second inorganic mask patterns 85, the second inorganic mask patterns 85 may be removed during etching of the first inorganic mask layer 40. Alternatively, after the first inorganic mask pattern 45 is formed, an additional process may be performed to remove the second inorganic mask patterns 85.

The second organic mask patterns 75 and the second inorganic mask patterns 85 may be removed by an ashing process. Accordingly, top surfaces of the buffer mask patterns 55 may be exposed, and portions of the first inorganic mask pattern 45 between the buffer mask patterns 55 may be exposed.

Figure 6:
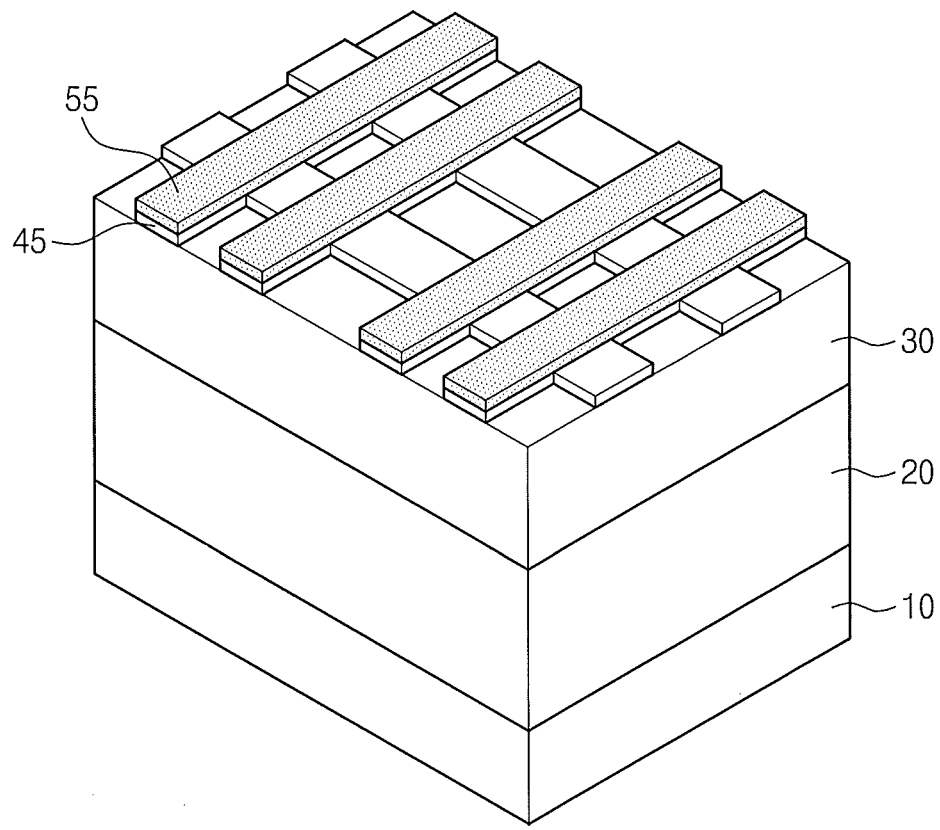
Figure 7:
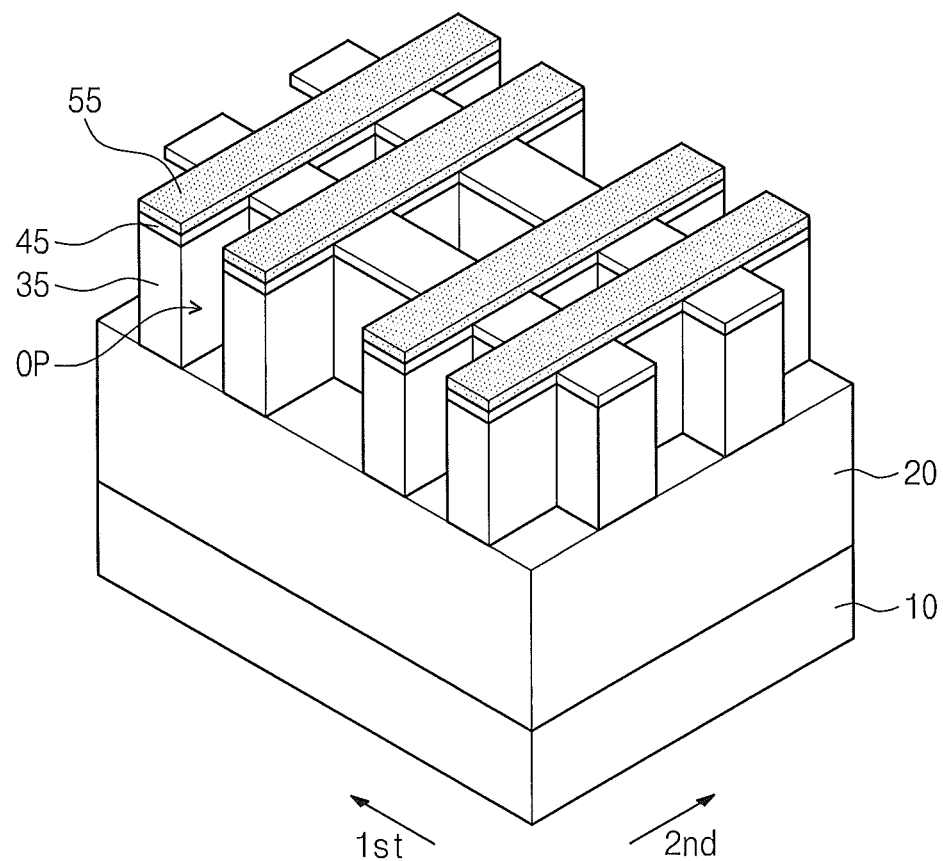

Referring to FIG. 7, the first organic mask layer 30 of FIG. 6 is anisotropically etched using the first inorganic mask pattern 45 as an etch mask to form a first organic mask pattern 35. The process etching the first organic mask layer may use a mixture gas of a fluorine-based etch gas and an oxygen ($O_2$) gas, or a mixture gas of the fluorine-based etch gas, the oxygen ($O_2$) gas, and an argon (Ar) gas. Here, the fluorine-based etch gas may include $C_3F_6$, $C_4F_6$, $C_4F_8$, and/or $C_5F_8$.

Since the first organic mask layer 30 is anisotropically etched, the shape of the first inorganic mask pattern 45 may be transferred to the first organic mask layer 30. Therefore, the first organic mask pattern 35 may be formed to have openings OP respectively exposing predetermined regions the lower target layer 20.

The first inorganic mask pattern 45 and the buffer mask patterns 55 may have an etch selectivity ratio of at least about 1:10 with respect to the first organic mask layer 30 in the etch process forming the first organic mask pattern 35. Thus, the first inorganic mask pattern 45 and the buffer mask patterns 55 may substantially maintain thicknesses thereof during etching of the first organic mask layer 30 thicker than the first inorganic and buffer mask patterns 45 and 55.

As described above, a mask pattern can be formed that includes non-metallic first spaced-apart portions that extend in a first direction (as shown in FIG. 7) on the lower target layer 20 and non-metallic second spaced-apart portions that extend in a second direction (i.e., the mesh pattern shown in FIG. 7) on the lower target layer 20 to cross-over the non-metallic first spaced-apart portions at particular locations defined by the cross-over.

Figure 8:
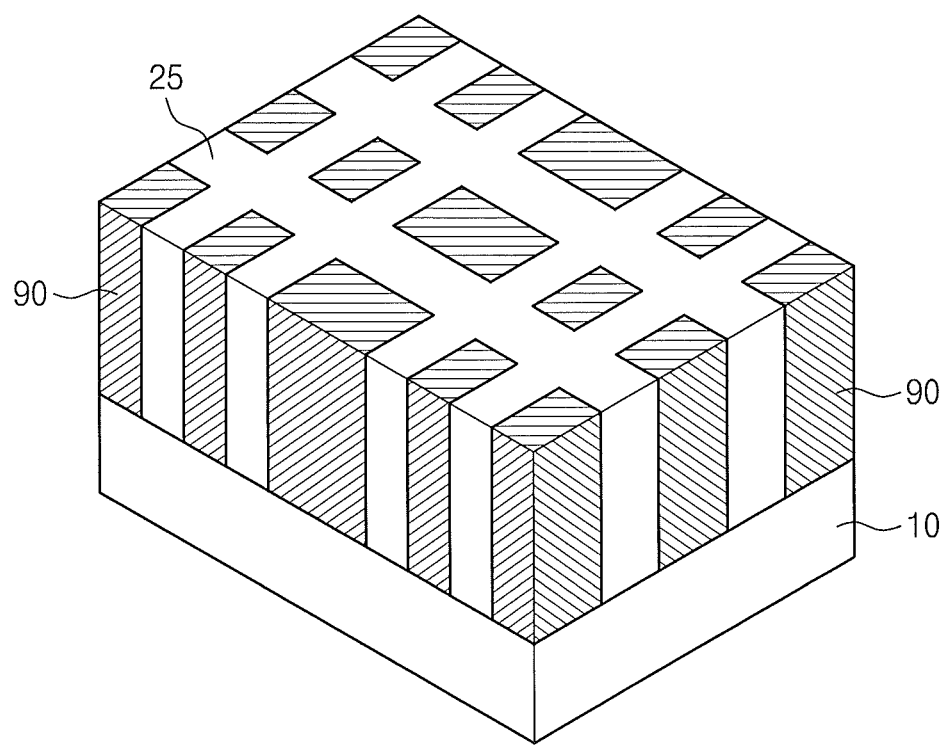

Subsequently, the lower target layer 20 may be etched using the first organic mask pattern 35 as an etch mask. In other words, shapes of the openings OP formed in the first organic mask pattern 35 may be transferred to the lower target layer 20, such that holes arranged in matrix form may be formed in the lower target layer 20. As a result, a lower pattern 25 having a top surface of a lattice-shape (or a mesh-shape) may be formed as illustrated in FIG. 8. On the other hand, if the lower pattern 25 is formed of the same material as the buffer mask patterns 55 of FIG. 7, the buffer mask patterns 55 may be removed during the process etching the lower target layer 20.

A planar area of each of the holes in the lower pattern 25 may be changed depending on pitches and widths of the buffer mask patterns 55 and the second inorganic mask patterns 85 described with reference to FIGS. 3 and 4. Thus, diameters of neighboring holes may be different from each other. In other words, the holes respectively having diameters different from each other may be formed in the lower patterns 25.

After the lower patterns 25 are formed, a process removing the first inorganic mask pattern 45 and a process removing the first organic mask pattern 35 may be performed. In more detail, if the first inorganic mask pattern 45 is formed of a silicon oxynitride, it may be removed by a wet etch process or a dry cleaning process. In some embodiments, the wet etch process for removing the first inorganic mask pattern 45 may use a hydrogen fluoride solution as an etchant. Alternatively, the dry cleaning process for removing the first inorganic mask pattern 45 may be performed using an ammonia ($NH_3$) gas and a hydrogen fluoride gas. The first organic mask pattern 35 may be removed by an ashing process and/or a stripping process.

Accordingly, because the first and second spaced-apart portions described in reference to FIG. 7 are free of metals, the mask pattern may be removed without the use of materials that would otherwise damage adjacent metal structures, such as structures that could be included as gate electrodes in transistor devices having associated source/drain regions. As appreciated by the present inventors, the use of non-metallic materials in the first and second spaced-apart portions of the mask patterns can avoid the use of materials which, may otherwise damage metallic structures, such as gate electrodes, when the mask is removed.

Next, referring to FIG. 8, a filling layer may be formed on the lower pattern 25 to fill the holes. Here, the filling layer may be formed of a material having an etch selectivity with respect to the lower pattern 25. For example, the filling layer may be formed of a conductive material, a semiconductor material, or an insulating material. The filling layer may be planarized until the lower pattern 25 is exposed, such that fine patterns 90 may be formed in the holes, respectively. Widths of the fine patterns 90 may be different from each other by the diameters of the holes. Additionally, distances between the fine patterns 90 may be different from each other.

A method for manufacturing a semiconductor device according to other embodiments of the inventive concept will be described hereinafter. According to other embodiments of the inventive concept, the semiconductor device may be a static random access memory (SRAM) device.

Figure 9:
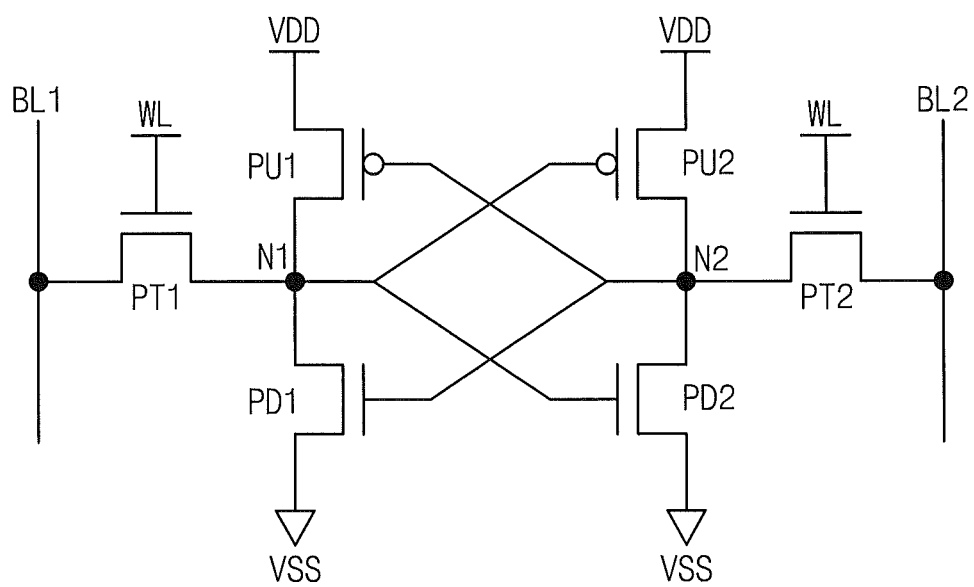
FIG. 9 is a circuit diagram illustrating a unit cell of a semiconductor device according to some embodiments of the inventive concept.

FIG. 9 is a circuit diagram illustrating a unit cell of a semiconductor device according to some embodiments of the inventive concept.

The SRAM device will be described briefly. Referring to FIG. 9, one SRAM cell may include first and second pass transistors PT1 and PT2, first and second pull-up transistors PU1 and PU2, and first and second pull-down transistors PD1 and PD2. The first and second pass transistors PT1 and PT2 and the first and second pull-down transistors PD1 and PD2 may be NMOS transistors, and the first and second pull-up transistors PU1 and PU2 may be PMOS transistors.

The first pull-up transistor PU1 and the first pull-down transistor PD1 may constitute a first inverter, and the second pull-up transistor PU2 and the second pull-down transistor PD2 may constitute a second inverter.

A source of the first pull-up transistor PU1 may be connected to a power line VDD, and a source of the first pull-down transistor PD1 may be connected to a ground (or reference) line VSS. A drain of the first pull-up transistor PU1 may be connected to a drain of the first pull-down transistor PD1. The drains of the first pull-up and first pull-down transistors PU1 and PD1 may correspond to an output terminal N1 of the first inverter. Gates of the first pull-up and first pull-down transistors PU1 and PD1 may be connected to each other and correspond to an input terminal of the first inverter.

A source of the second pull-up transistor PU2 may be connected to the power line VDD, and a source of the second pull-down transistor PD2 may be connected to the ground line VSS. A drain of the second pull-up transistor PU2 may be connected to a drain of the second pull-down transistor PD2.

The drains of the second pull-up and second pull-down transistors PU2 and PD2 may correspond to an output terminal N2 of the second inverter. Gates of the second pull-up and second pull-down transistors PU2 and PD2 may be connected to each other and correspond to an input terminal of the second inverter.

The input terminal and the output terminal N1 of the first inverter are cross-connected to the input terminal and the output terminal N2 of the second inverter for constituting a latch circuit. In other words, the gates (i.e., the input terminal of the first inverter) of the first pull-up and the first pull-down transistors PU1 and PD1 may be connected to the output terminal N2 of the second inverter, and the gates (i.e., the input terminal of the second inverter) of the second pull-up and the second pull-down transistors PU2 and PD1 may be connected to the output terminal N1 of the first inverter.

Additionally, a source of the first pass transistor PT1 may be connected to the output terminal N1 of the first inverter, and a source of the second pass transistor PT2 may be connected to the output terminal N2 of the second inverter.

A drain of the first pass transistor PT1 may be connected to a first bit line BL1, and a drain of the second pass transistor PT2 may be connected to a second bit line BL2. Gates of the first and second pass transistors PT1 and PT2 may be connected to a word line WL.

Hereinafter, a method for manufacturing the semiconductor device according to other embodiments of the inventive concept will be described in detail with reference to FIGS. 10A through 15A, 10B through 15B, and 10C through 15C.

FIGS. 10A through 15A are plan views illustrating a method for manufacturing a semiconductor device according to other embodiments of the inventive concept. FIGS. 10B through 15B are cross-sectional views taken along lines I-I' of FIGS. 10A through 15A, respectively. FIGS. 10C through 15C are cross-sectional views taken along lines II-II' of FIGS. 10A through 15A, respectively.

Figure 10A:
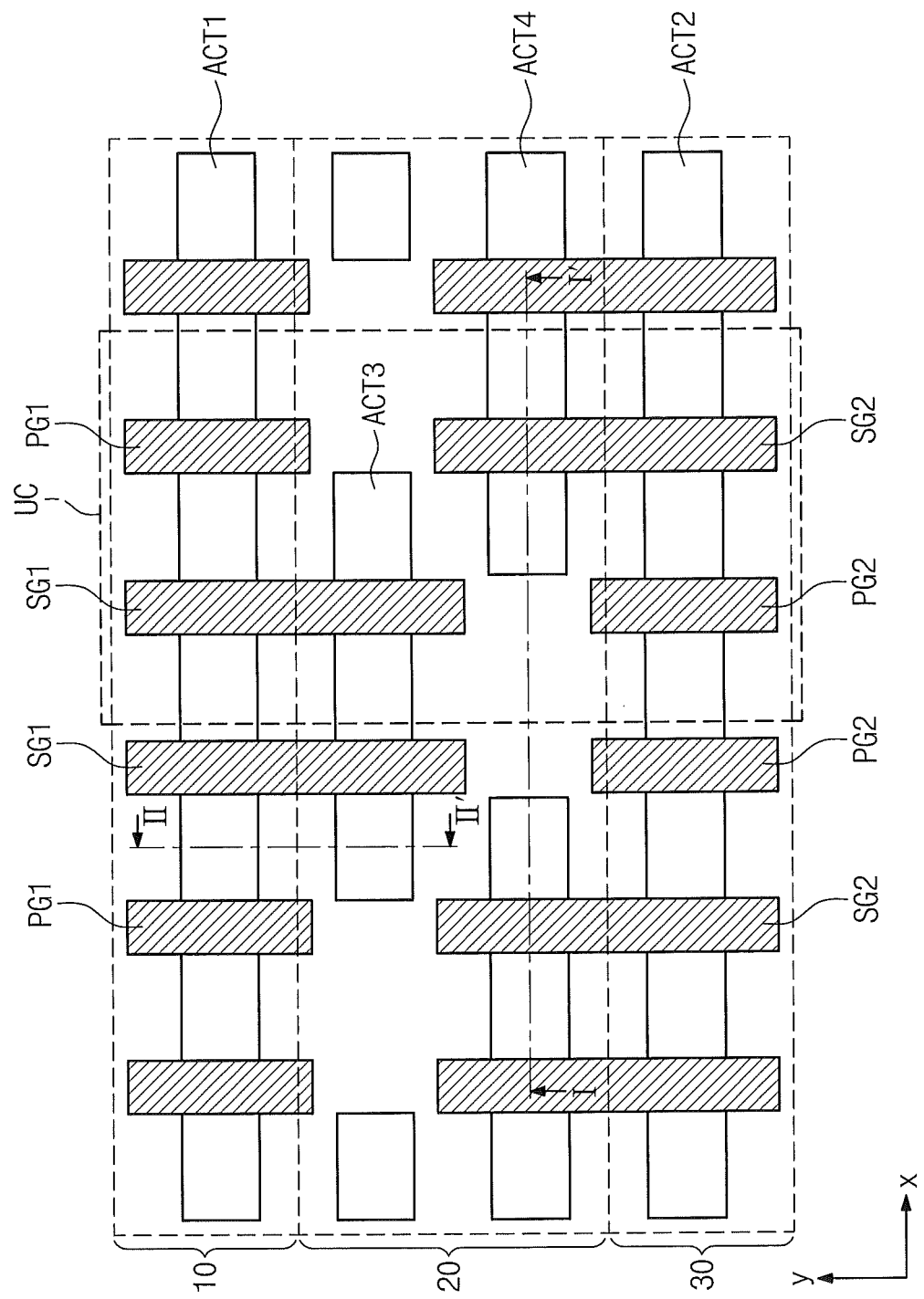
Figure 10B:
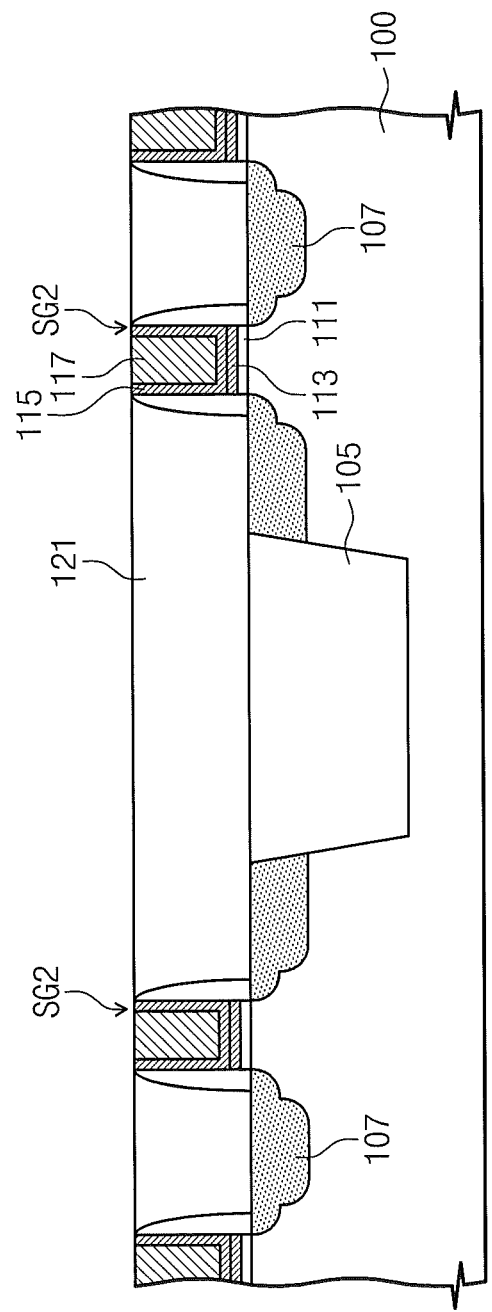
Figure 10C:
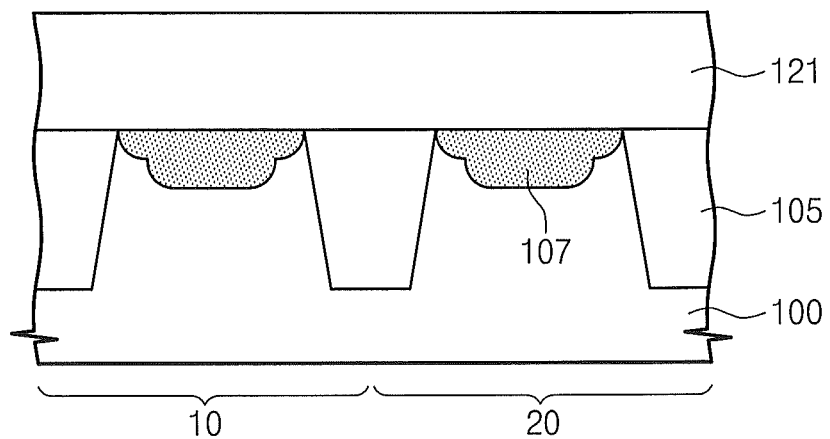

Referring to FIGS. 10A, 10B, and 10C, a semiconductor substrate 100 may include first and second N-type well regions 10 and 30, and a P-type well region 20 disposed between the first and second N-type well regions 10 and 30. The P-type well region 20 may make PN-junctions with the first and second N-type well regions 10 and 30.

In some embodiments, one SRAM cell UC may include first and second NMOS active portions ACT1 and ACT2 and first and second PMOS active portions ACT3 and ACT4. The first and second PMOS active portions ACT3 and ACT4 may be disposed between the first NMOS active portion ACT1 and the second NMOS active portion ACT2. The first and second NMOS active portions ACT1 and ACT2 may be line-shaped and extend in a particular direction (e.g., an x-axis direction). The first and second PMOS active portions ACT3 and ACT4 may have bar-shapes that are shorter than each of the first and second NMOS active portions ACT1 and ACT2 in a plan view. The first and second PMOS active portions ACT3 and ACT4 may be parallel to each other in the x-axis direction, but end portions of the first and second PMOS active portions ACT3 and ACT4 may not be overlapped with each other in a y-axis direction.

Additionally, the one SRAM cell UC may include first and second shared gate electrodes SG1 and SG2 and first and second pass gate electrodes PG1 and PG2. In some embodiments, the first shared gate electrode SG1 may cross over the first NMOS active portion ACT1 and the first PMOS active portion ACT3. The second shared gate electrode SG2 may cross over the second NMOS active portion ACT2 and the second PMOS active portion ACT4. The first pass gate electrode PG1 may be spaced apart from the first shared gate electrode SG1 and cross over the first NMOS active portion ACT1, and the second pass gate electrode PG2 may be spaced apart from the second shared gate electrode SG2 and cross over the second NMOS active portion ACT2. The first and second shared gate electrodes SG1 and SG2 may be space apart from each other in a first diagonal direction with respect to the x-axis direction in a plan view, and the first and second pass gate electrodes PG1 and PG2 may be spaced apart from each other in a second diagonal direction with respect to the x-axis direction in a plan view.

A first bit line dopant region may be formed in the first NMOS active portion ACT1 at a side of the first pass gate electrode PG1, and a first ground dopant region may be formed in the first NMOS active portion ACT1 at a side of the first shared gate electrode SG1. A first shared dopant region may be formed in the first NMOS active portion ACT1 between the first pass gate electrode PG1 and the first shared gate electrode SG1. A second bit line dopant region may be formed in the second NMOS active portion ACT2 at a side of the second pass gate electrode PG2, and a second ground dopant region may be formed in the second NMOS active portion ACT2 at a side of the second shared gate electrode SG2. A second shared dopant region may be formed in the second NMOS active portion ACT2 between the second pass gate electrode PG2 and the second shared gate electrode SG2. The first and second bit line dopant regions, the first and second ground dopant regions, and the first and second shared dopant regions may be doped with N-type dopants.

A first drain dopant region may be formed in the first PMOS active portion ACT3 at a side of the first shared gate electrode SG1, and a first power dopant region may be formed in the first PMOS active portion ACT3 at another side of the first shared gate electrode SG1. A second drain dopant region may be formed in the second PMOS active portion ACT4 at a side of the second shared gate electrode SG2, and a second power dopant region may be formed in the second PMOS active portion ACT4 at another side of the second shared gate electrode SG2. The first and second drain dopant regions and the first and second power dopant regions may be doped with P-type dopants.

Referring to FIGS. 10A, 10B, and 10C, the semiconductor substrate 100 may be a silicon substrate, a germanium substrate, or a silicon-germanium substrate. Predetermined regions of the semiconductor substrate 100 may be doped with N-type dopants to form the first and second N-type well regions 10 and 30. A region of the semiconductor substrate 100 between the first and second N-type well regions 10 and 30 may be doped with P-type dopants to form the P-type well region 20.

A device isolation pattern 105 may be formed in the semiconductor substrate 100 to define the first and second NMOS active portions ACT1 and ACT2 and the first and second PMOS active portions ACT3 and ACT4. The device isolation pattern 107 may include oxide, nitride, and/or oxynitride.

The first and second pass gate electrodes PG1 and PG2 and the first and second shared gate electrodes SG1 and SG2 may have substantially the same stack-structure. Each of the gate electrodes PG1, PG2, SG1, and SG2 may include a metal gate pattern 117, a gate insulating layer 111 between the metal gate pattern 117 and the semiconductor substrate 100, and a first barrier metal pattern 113 between the metal gate pattern 117 and the gate insulating layer 111. A second barrier metal pattern 115 may further be disposed between the first barrier metal pattern 113 and the metal gate pattern 117. The second barrier metal pattern 115 may extend onto both sidewalls of the metal gate pattern 117. The gate insulating layer 111 may include an oxide, a nitride, an oxynitride, and/or a high-k dielectric material (e.g., an insulating metal oxide such as a hafnium oxide and/or an aluminum oxide). The metal gate pattern 117 may be formed of a metal material such as aluminum, tungsten, or molybdenum. The first and second barrier metal patterns 113 and 115 may be formed of a conductive metal nitride such as a tungsten nitride (WN), tantalum nitride (TaN), a titanium nitride (TiN), and/or titanium-aluminum nitride (TiAlN).

Dopant regions 107 may be formed in the active portions ACT1, ACT2, ACT3, and ACT4 at both sides of the gate electrodes PG1, PG2, SG1, and SG2. The dopant regions 107 in the first and second NMOS active portions ACT1 and ACT2 may be doped with N-type dopants, and the dopant regions 107 in the first and second PMOS active portions ACT3 and ACT4 may be doped with P-type dopants.

In some embodiments, after first interlayer insulating layer 121 is formed on the semiconductor substrate 100, the second barrier metal pattern 115 and the metal gate pattern 117 may be formed. After sacrificial gate patterns and the dopant regions 107 are formed on the semiconductor substrate 100, the first interlayer insulating layer 121 may be formed to cover the sacrificial gate patterns. The first interlayer insulating layer 121 may be planarized until top surfaces of the sacrificial gate patterns are exposed. Subsequently, the sacrificial gate patterns may be removed and then the second barrier metal pattern 115 and the metal gate pattern 117 may be formed in each of empty regions formed by the removal of the sacrificial gate patterns.

For example, the first interlayer insulating layer 121 may be formed of one of high density plasma (HDP) oxide, tetraethylorthosilicate (TEOS), plasma enhanced tetraethylorthoSilicate (PE-TEOS), O3-tetraethylorthosilicate (O3-TEOS), undoped silicate glass (USG), borosilicate glass (BSG), borophosphosilicate glass (BPSG), fluoride silicate glass (FSG), spin on glass (SOG), tonen silazene (TOSZ), or any combination thereof.

Figure 11A:
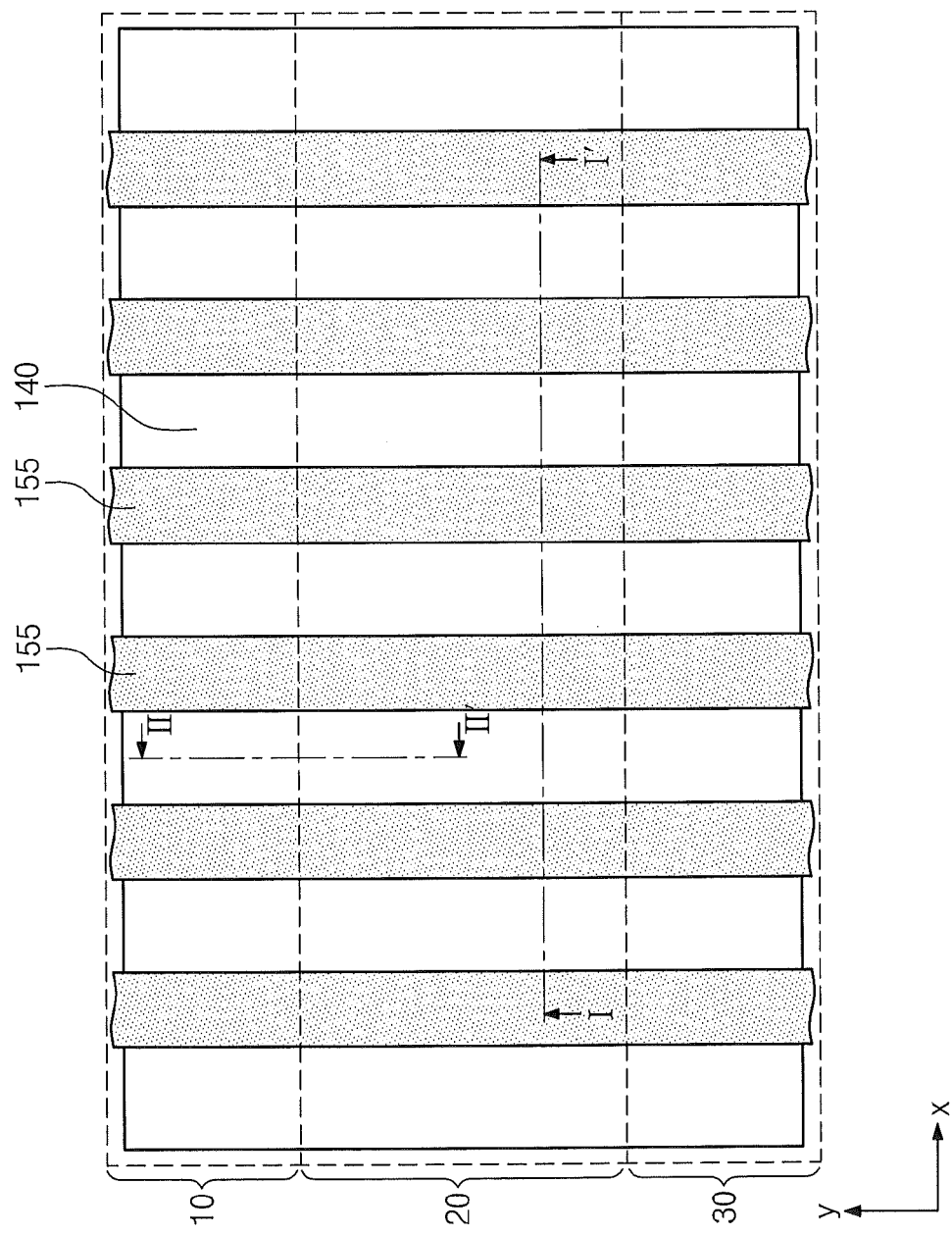
Figure 11B:
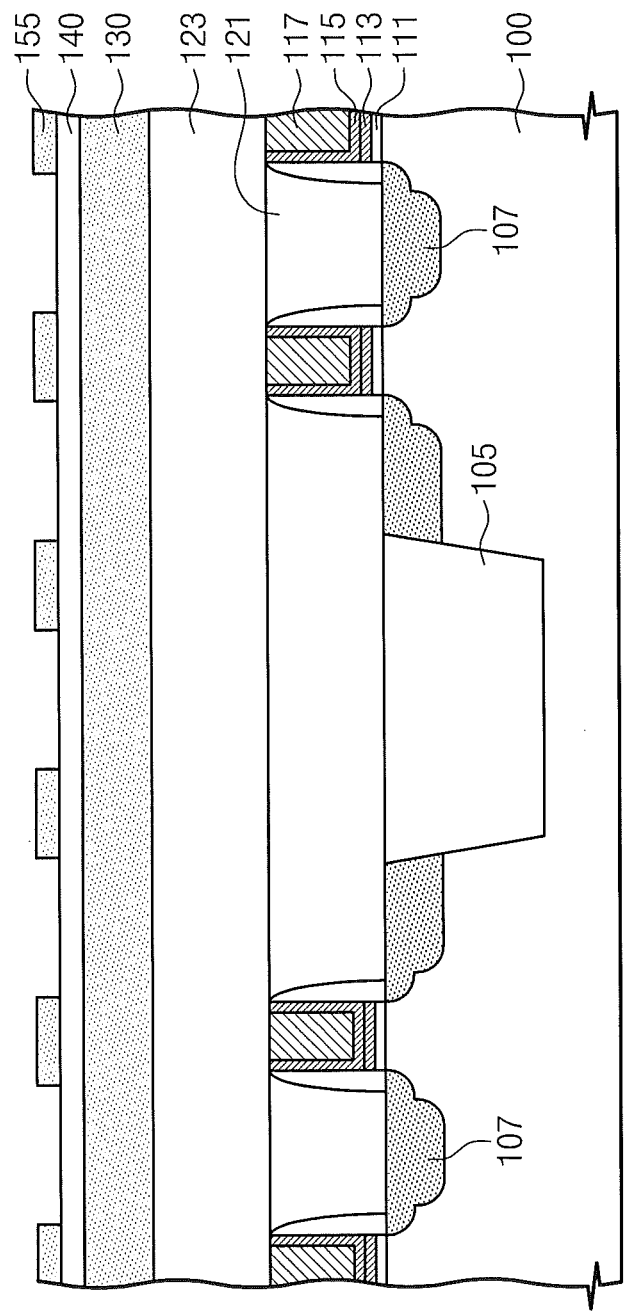
Figure 11C:
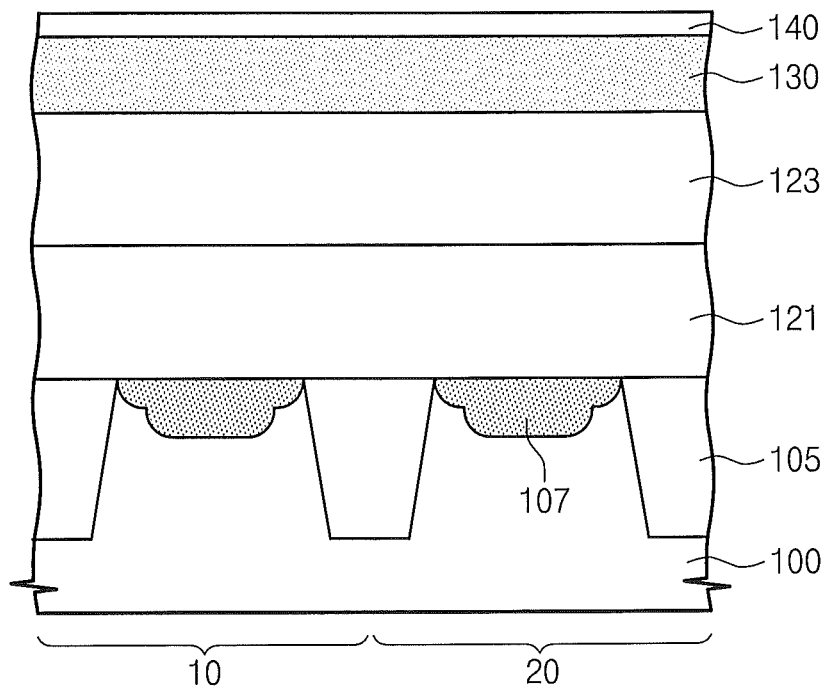

Referring to FIGS. 11A, 11B, and 11C, a second interlayer insulating layer 123 may be formed on the first interlayer insulating layer 121. In some embodiments, the second interlayer insulating layer 123 may cover top surfaces of the metal gate patterns 117.

Next, a first organic mask layer 130 and a first inorganic mask layer 140, as described with reference to FIG. 1, may be sequentially formed on the second interlayer insulating layer 123. The first organic mask layer 130 and the first inorganic mask layer 140 may constitute a first hard mask layer. The first inorganic mask layer 140 may be formed of a material an etch selectivity with respect to the first organic mask layer 130. The first inorganic mask layer 140 may be formed of a non-metallic material which does not include metal. For example, the first inorganic mask layer 140 may be formed of at least one of silicon-based materials such as a silicon oxide layer, a silicon nitride layer, a silicon oxynitride layer, a silicon carbonitride layer, and a poly-silicon layer.

Subsequently, as described with reference to FIGS. 2 and 3, a buffer mask layer on the first inorganic mask layer 140 may be patterned to form buffer mask patterns 155. The buffer mask patterns 155 may be line-shaped and expose portions of the first inorganic mask layer 140.

In some embodiments, the buffer mask patterns 155 may be formed of a material having an etch selectivity with respect to the first inorganic mask layer 140. The buffer mask patterns 155 may be formed of a non-metallic material which does not include metal. For example, the buffer mask patterns 155 may be formed of at least one of silicon-based materials such as a silicon oxide layer, a silicon nitride layer, a silicon oxynitride layer, a silicon carbonitride layer, and a poly-silicon layer.

Here, the buffer mask patterns 155 may be formed of a material different from that of the first inorganic mask layer 140.

In some embodiments, if the first inorganic mask layer 140 is formed of a silicon nitride layer and/or a silicon oxynitride layer, the buffer mask patterns 155 may be formed of a silicon oxide. For example, the buffer mask patterns 155 may be formed of one of high density plasma (HDP) oxide, tetraethylorthosilicate (TEOS), plasma enhanced tetraethylorthoSilicate (PE-TEOS), O3-tetraethylorthosilicate (O3-TEOS), undoped silicate glass (USG), borosilicate glass (BSG), borophosphosilicate glass (BPSG), fluoride silicate glass (FSG), spin on-glass (SOG), tonen silazene (TOSZ), or any combination thereof. In other embodiments, if the first inorganic mask layer 140 is formed of a silicon oxide layer, the buffer mask patterns 155 may be formed of a silicon nitride and/or a silicon oxynitride.

In some embodiments, the buffer mask patterns 155 may be line-shaped crossing over the active portions AC1, ACT2, ACT3, and ACT4 of FIG. 10A defined in the semiconductor substrate 100. In a plan view, the buffer mask patterns 155 may be overlapped with the gate electrodes PG1, PG2, SG1, and SG2 of FIG. 10A. Alternatively, the buffer mask patterns 155 may be disposed to cross over the gate electrodes PG1, PG2, SG1, and SG2 of FIG. 10A and be disposed between the active portions ACT1, ACT2, ACT3, and ACT4 in a plan view.

Figure 12A:
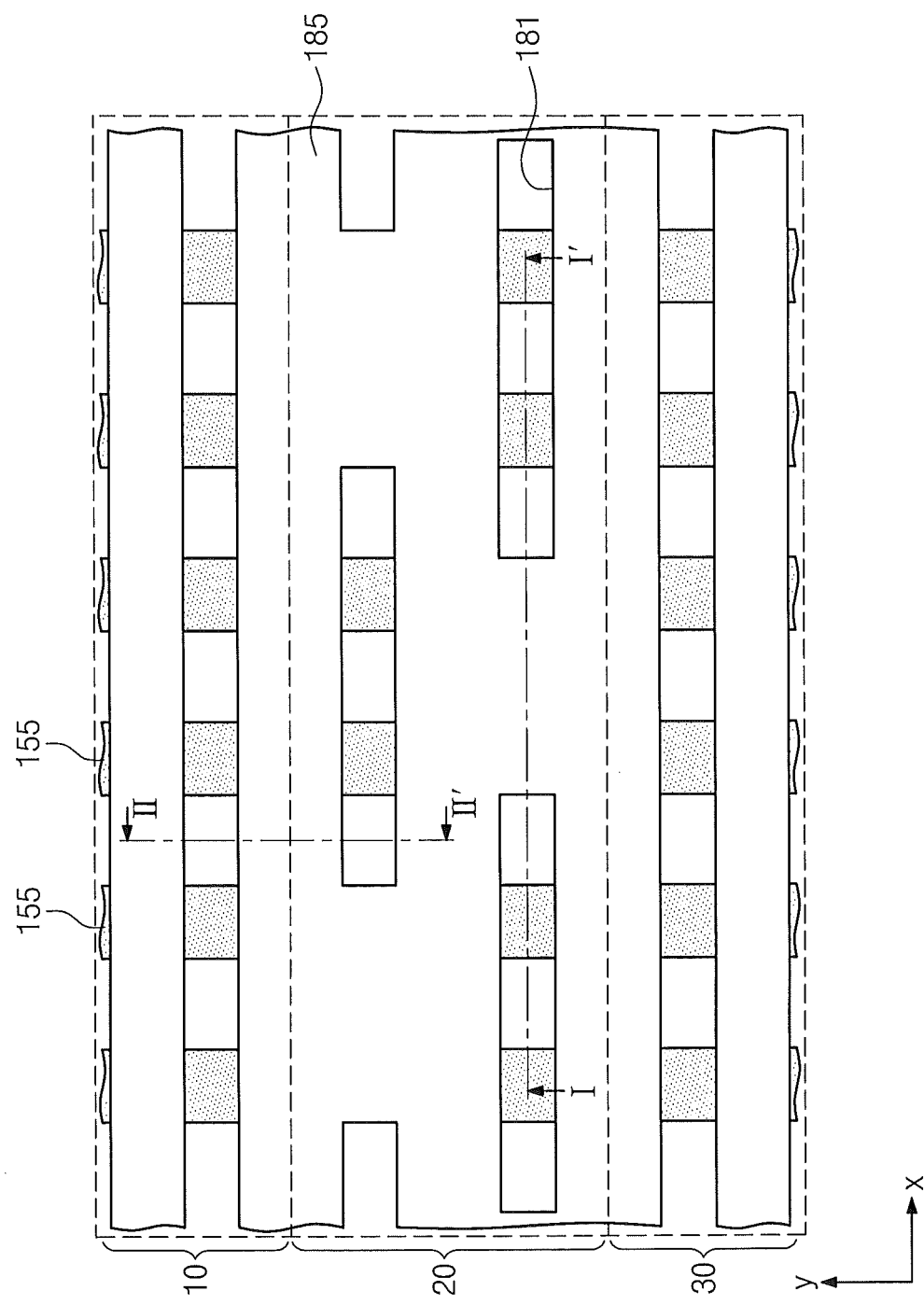
Figure 12B:
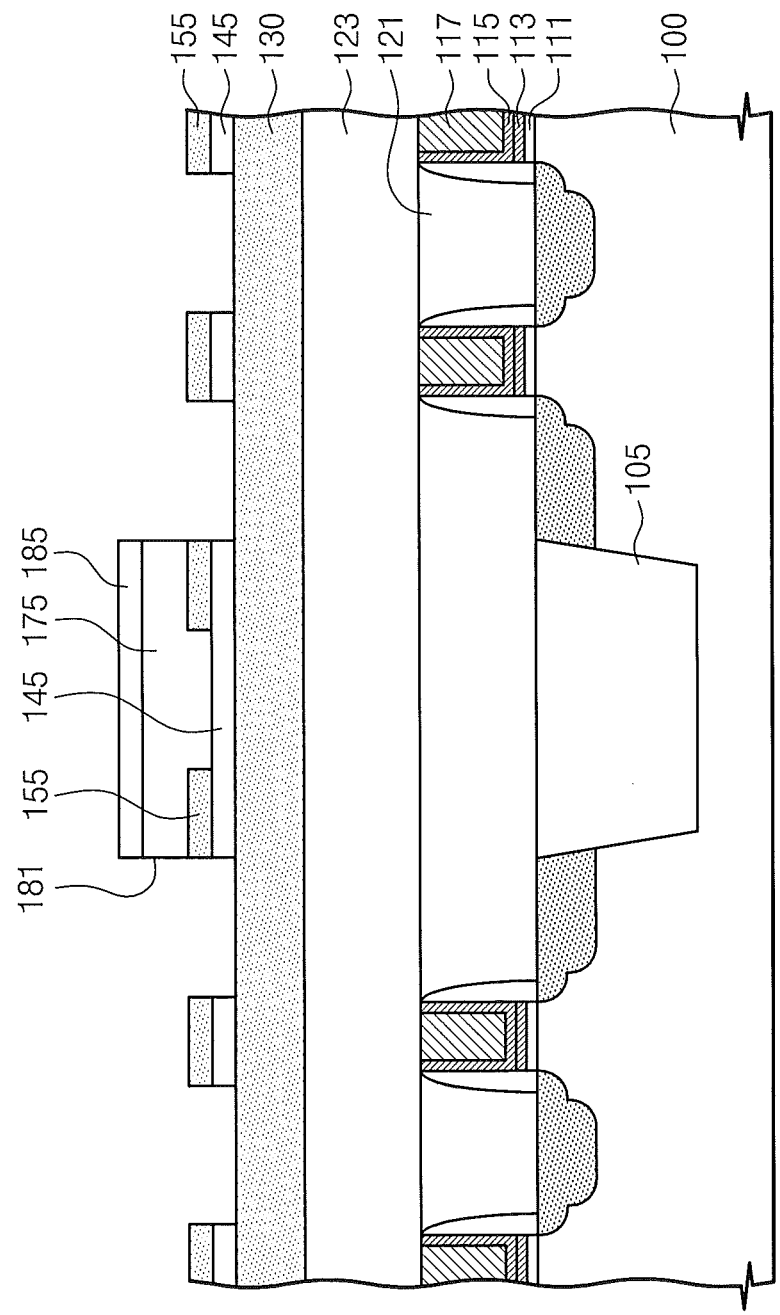
Figure 12C:
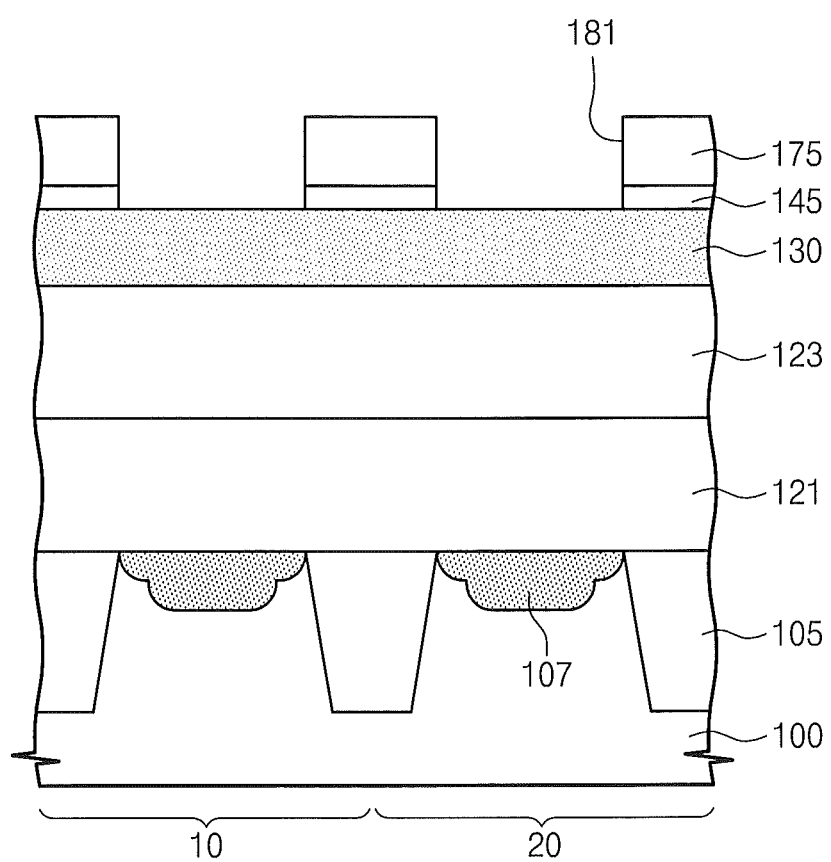

Referring to FIGS. 12A, 12B, and 12C, as described with reference to FIG. 4, second organic mask patterns 175 and second inorganic mask patterns 185 may be formed on the buffer mask patterns 155. The second organic mask pattern 175 and the second inorganic mask pattern 185 sequentially stacked may constitute a second hard mask pattern.

The second organic mask patterns 175 and the second inorganic mask patterns 185 may cross over the buffer mask patterns 155 and have openings 181 overlapped with portions the active portions ACT1, ACT2, ACT3, and ACT4 of FIG. 10A in a plan view.

In the present embodiment, the second organic mask patterns 175 and the second inorganic mask patterns 185 may cover a region between the first and second PMOS active portions ACT3 and ACT4 of FIG. 10A. In other words, the second organic mask pattern 175 and the second inorganic mask pattern 185 may have shielding parts covering the device isolation pattern 105 between the first and second PMOS active portions ACT3 and ACT4.

Subsequently, the first inorganic mask layer 140 is etched using the second organic mask patterns 175, the second inorganic mask patterns 185, and the buffer mask patterns 155 as etch masks to form a first inorganic mask pattern 145. At this time, if the second inorganic mask pattern 184 is formed of the same material as the first inorganic mask layer 140, the second inorganic mask pattern 185 may be removed during the process etching the first inorganic mask layer 140.

After the first inorganic mask pattern 145 is formed, the second organic mask pattern 175 may be removed by an ashing process.

Figure 13A:
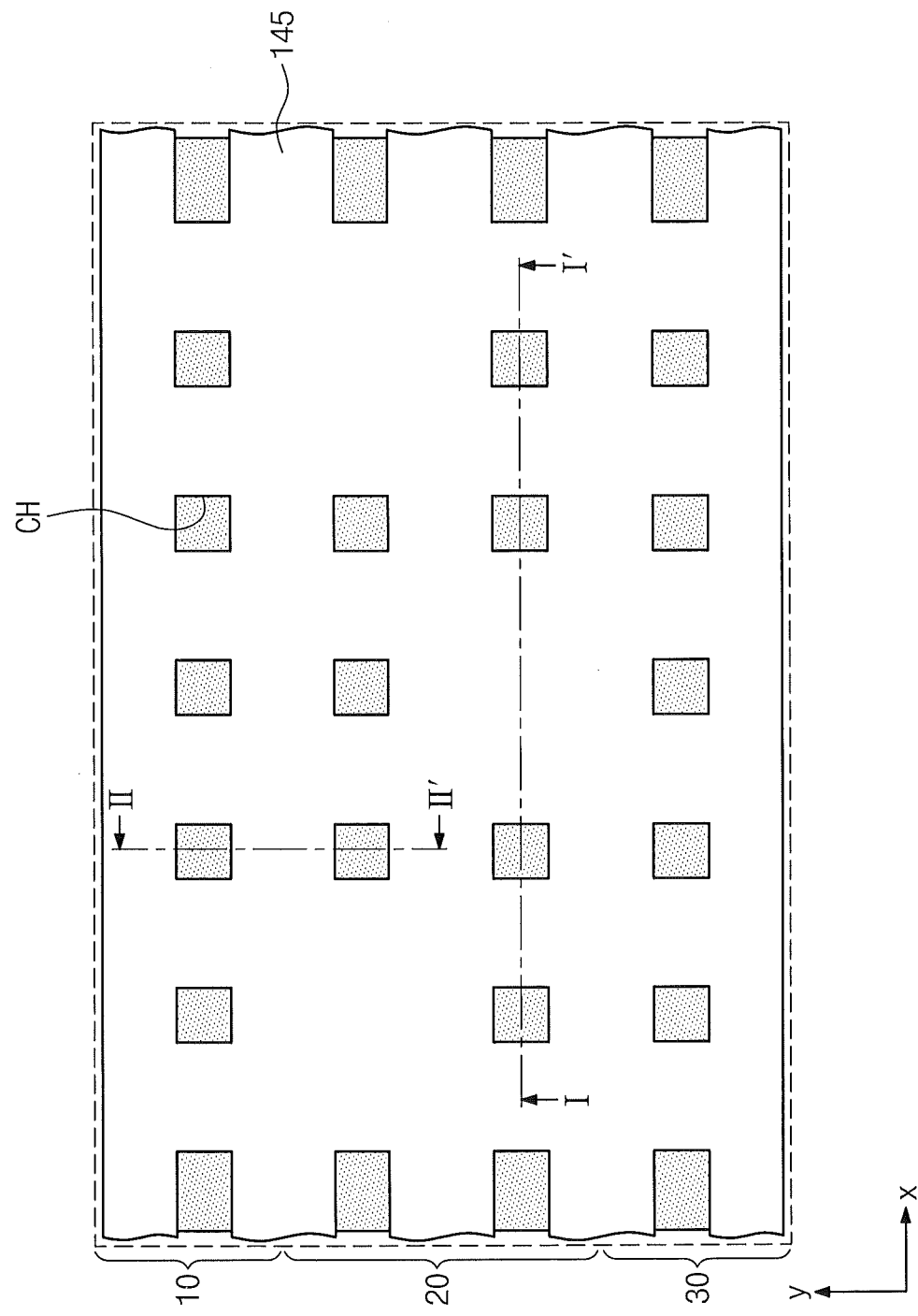
Figure 13B:
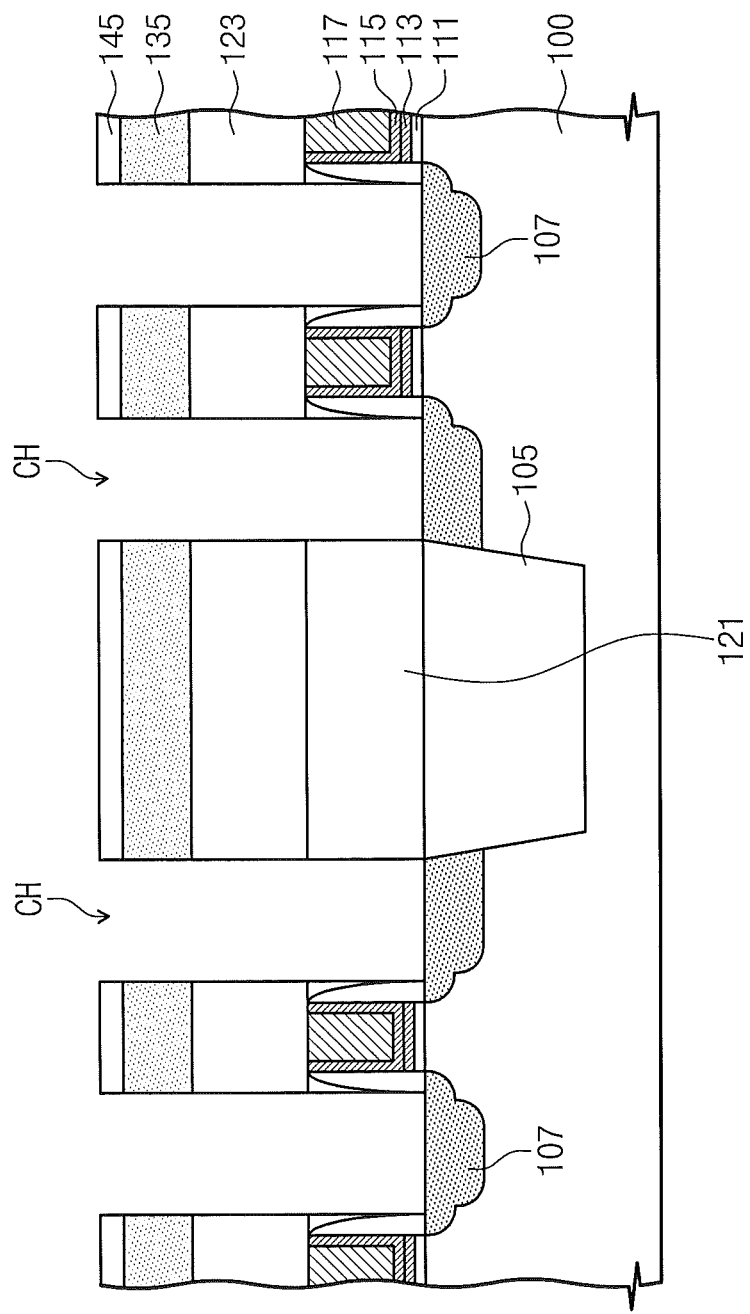
Figure 13C:
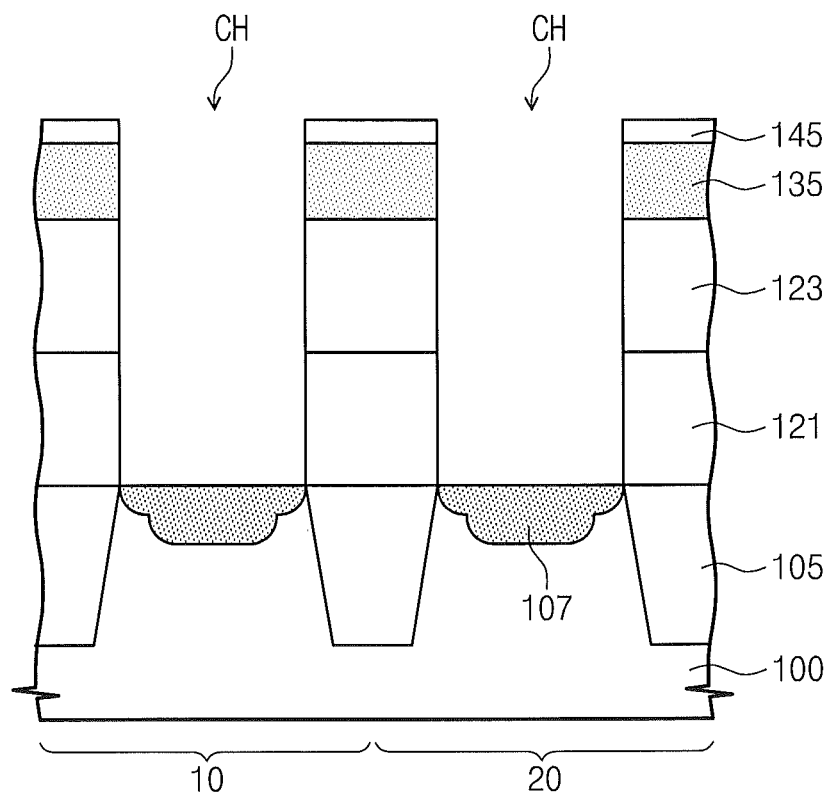

Referring to FIGS. 13A, 13B, and 13C, as described with reference to FIG. 7, the first organic mask layer 130 is etched using the first inorganic mask pattern 145 as an etch mask to form a first organic mask pattern 135. Thus, the first organic mask pattern 135 may have openings arranged in matrix form.

The second and first interlayer insulating layers 123 and 121 may be anisotropically etched using the first organic mask pattern 135 as an etch mask to form contact holes CH exposing the dopant regions 107. In more detail, the contact holes CH may be locally formed at both sides of the gate electrodes PG1, PG2, SG1, and SG2.

As described above, a mask pattern can be formed that includes non-metallic first spaced-apart portions that extend in a first direction (as shown in FIG. 7) on the lower target layer 20 and non-metallic second spaced-apart portions that extend in a second direction (as shown in FIG. 7) on the lower target layer 20 to cross-over the non-metallic first spaced-apart portions at particular locations defined by the cross-over.

As illustrated for example in FIG. 13B, because the first and second spaced-apart portions of the mask pattern include non-metallic materials, if any of the materials used to remove the mask pattern (used to form the contact holes CH) leak into the directly adjacent gate structure, any damage to the gate structure may be reduced as the materials used to remove non-metallic portions of the mask are less likely to damage the metal in the gate.

Figure 14A:
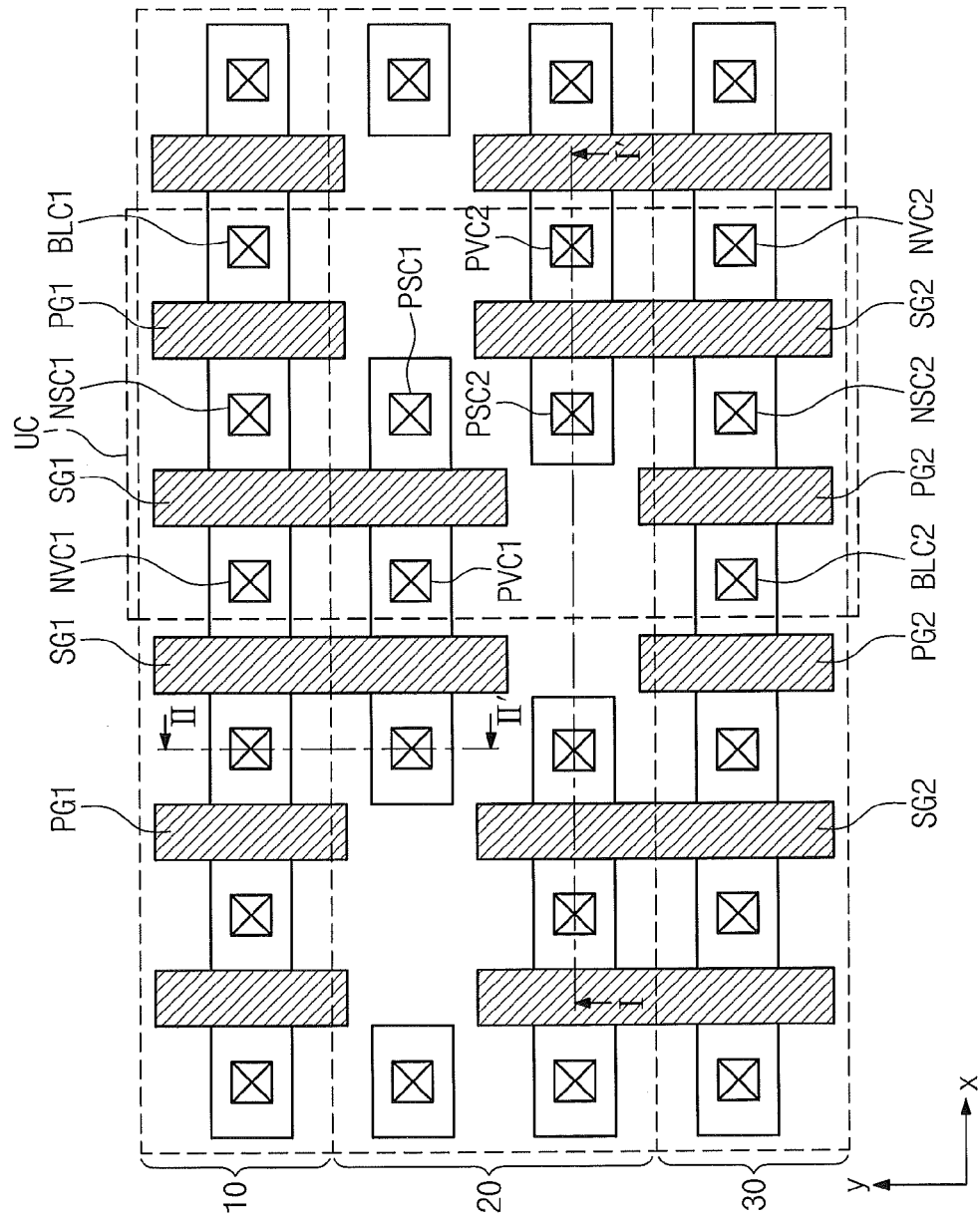
Figure 14B:
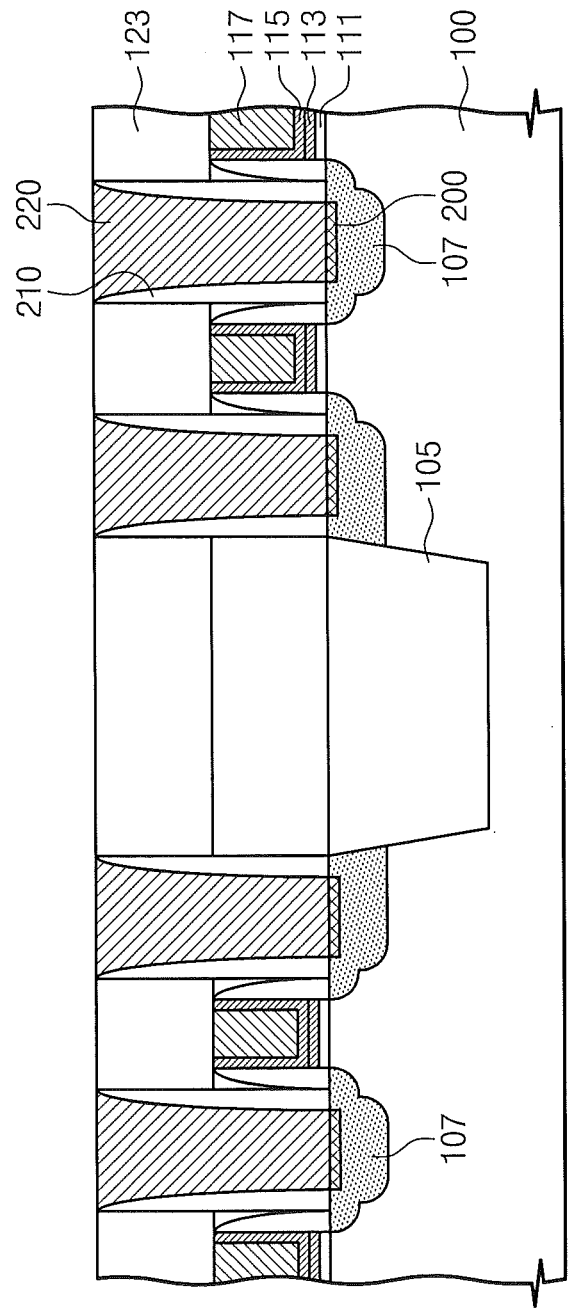
Figure 14C:
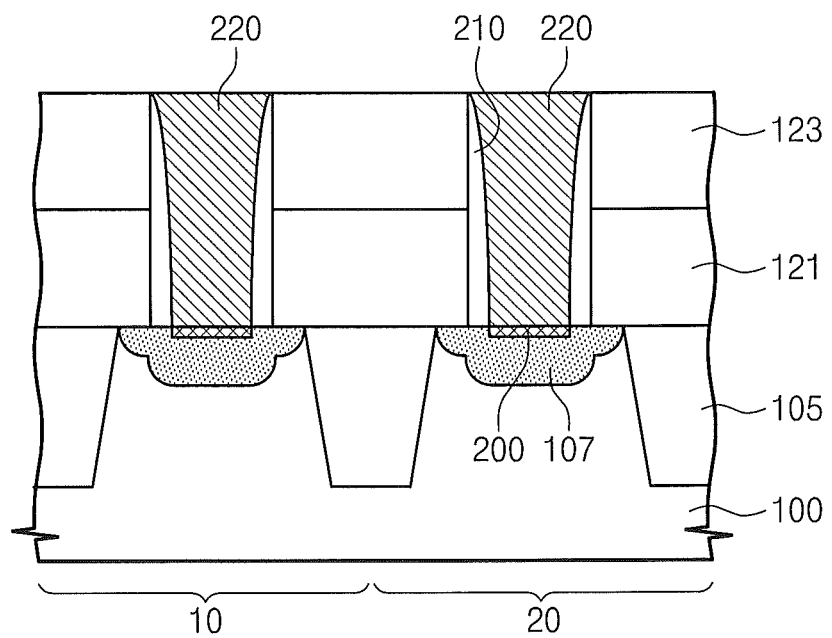

Referring to FIGS. 14A, 14B, and 14C, after the contact holes CH are formed, processes removing the buffer mask patterns 155, the first inorganic mask pattern 145, and the first organic mask pattern 135 may be sequentially performed using wet and/or dry etch processes.

In some embodiments, since the buffer mask pattern 155, the first inorganic mask pattern 145, and the first inorganic mask pattern 135 are formed of the non-metallic materials, a gas or a solution etching a metal material is not used in the processes removing the buffer mask pattern 155, the first inorganic mask pattern 145, and the first inorganic mask pattern 135. Thus, it is possible to prevent a chemical solution from permeating gate electrodes including metal materials in the processes removing the buffer mask pattern 155, the first inorganic mask pattern 145, and the first inorganic mask pattern 135.

Meanwhile, if the buffer mask patterns 155 are formed of the same material as the first and second interlayer insulating layers 121 and 123, the buffer mask patterns 155 may be removed during the process anisotropically etching the second and first interlayer insulating layers 123 and 121 without an additional removal process.

If the first inorganic mask pattern 145 is formed of a silicon oxynitride, the first inorganic mask pattern 145 may be removed using a wet etch process or a dry cleaning process. In some embodiments, the wet etch process for removing the first inorganic mask pattern 145 may use a hydrogen fluoride solution as an etchant. Alternatively, the dry cleaning process for removing the first inorganic mask pattern 145 may be performed using an ammonia ($NH_3$) gas and a hydrogen fluoride gas. The first organic mask pattern 135 may be removed by an ashing process and/or a stripping process.

Referring to FIGS. 14A, 14B, and 14C, after the contact holes CH are formed, a metal silicide layer 200 may be formed on a surface of each of the dopant regions 107 formed in the active portions ACT1, ACT2, ACT3, and ACT4.

In some embodiments, the metal silicide layer 200 may include at least one of a nickel (Ni) silicide layer, a cobalt (Co) silicide layer, a tungsten (W) silicide layer, a tantalum (Ta) silicide layer, a titanium (Ti) silicide layer, a hafnium (Hf) silicide layer, a nickel-tantalum (Ni—Ta) silicide layer, and a nickel-platinum (Ni—Pt) silicide layer.

Forming the metal silicide layer 200 may include forming a metal layer on the semiconductor substrate 100 having the contact holes CH, performing a thermal treatment process to react a metal material of the metal layer with silicon of the semiconductor substrate 100, and removing the metal layer unreacted with the silicon. In some embodiments, after the metal layer is formed, a capping metal layer may further be formed on the metal layer and then the thermal treatment process may be performed to form the metal silicide layer 200.

The metal layer may include one of nickel (Ni), cobalt (Co), tungsten (W), tantalum (Ta), titanium (Ti), and hafnium (Hf). In some embodiments, the metal layer may be a nickel layer. The nickel layer may be formed of a pure nickel or a nickel alloy. The nickel alloy may further contain at least one of tantalum (Ta), zirconium (Zr), titanium (Ti), hafnium (Hf), tungsten (W), cobalt (Co), platinum (Pt), molybdenum (Mo), palladium (Pd), vanadium (V), and niobium (Nb).

In some embodiments, before the metal silicide layer 200 is formed, an insulating spacer 210 may be formed on a sidewall of each of the contact hole. After the metal silicide layer 200 is formed, the insulating layer 210 may prevent the gate electrodes PG1, PG2, SG1, and SG2 from being damaged by a solution for removing the unreacted metal layer which is permeated along a interface between the first and second interlayer insulating layers 121 and 123.

Contact plugs 220 may be formed in the contact holes CH having the insulating spacers 210, respectively. The contact plugs 220 may include first and second bit line plugs BLC1 and BLC2, first and second power contact plugs PVC1 and PVC2, first and second ground contact plugs NVC1 and NVC2, first and second N-type node plugs NSC1 and NSC2, and first and second P-type node plugs PSC1 and PSC2 which are formed in the one SRAM cell UC as illustrated in FIG. 14A.

For example, the contact plugs 220 may be formed of at least one of a doped semiconductor (e.g., doped silicon), a metal (e.g., tungsten or aluminum), a conductive metal nitride (e.g., titanium nitride or tantalum nitride, or tungsten nitride), a transition metal (e.g., titanium or tantalum), and a semiconductor-metal compound (e.g., metal silicide).

Figure 15A:
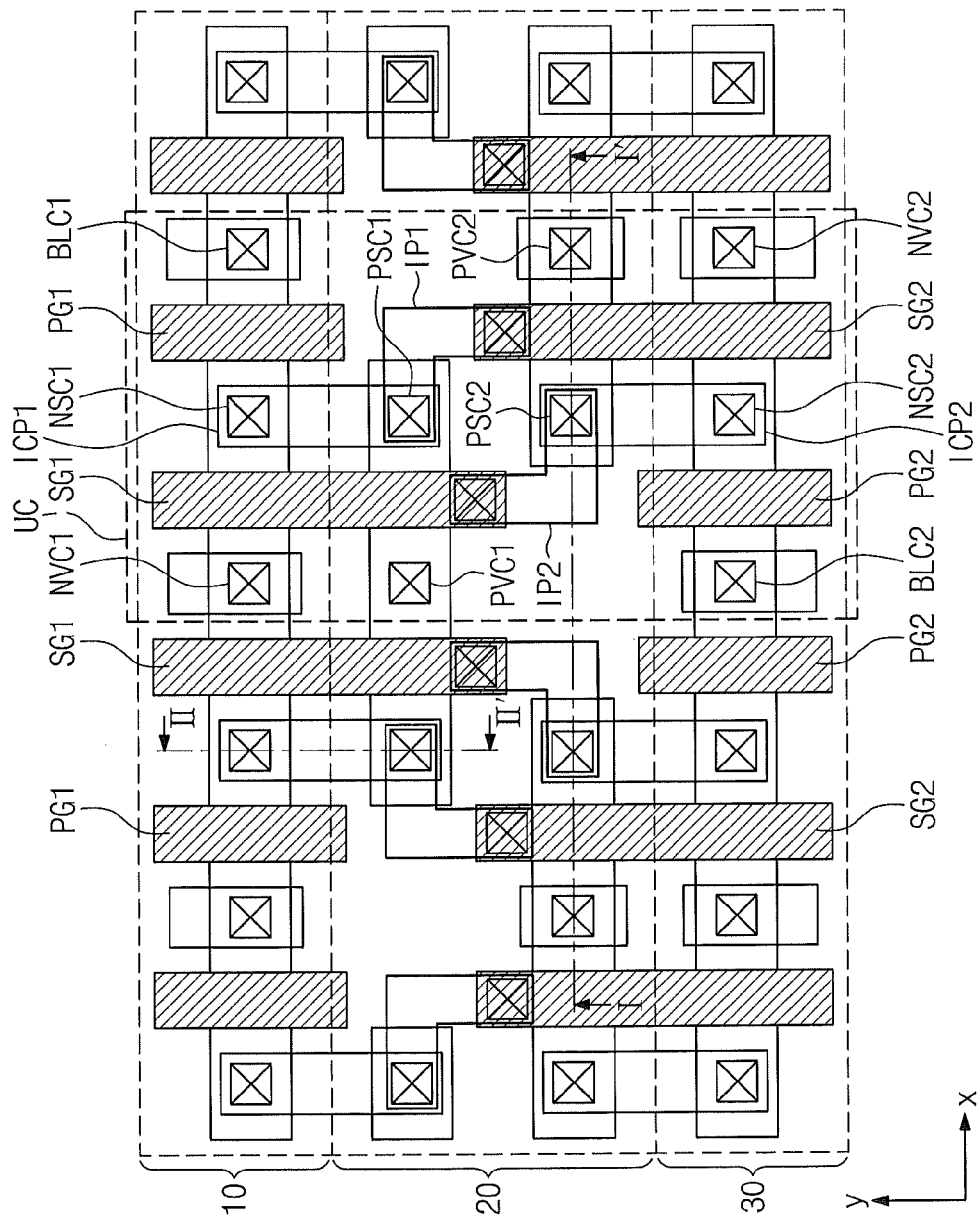
Figure 15B:
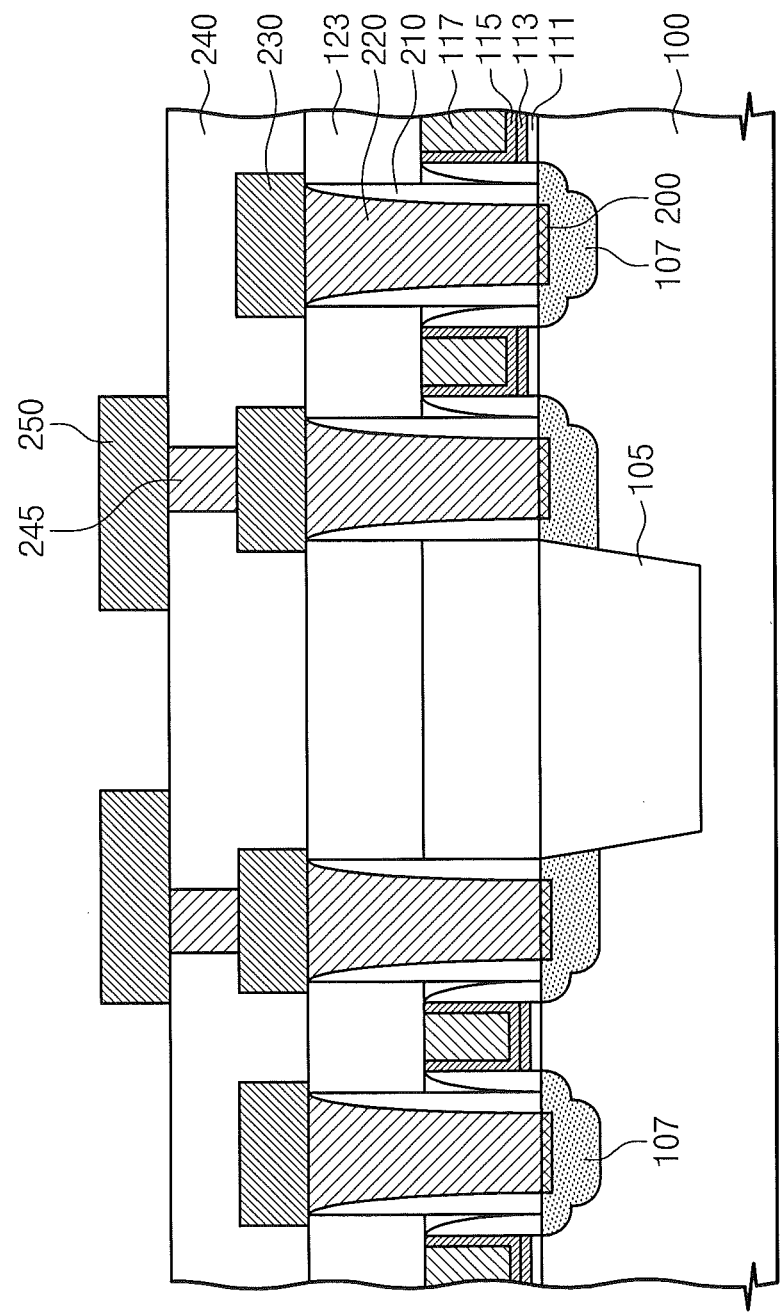
Figure 15C:
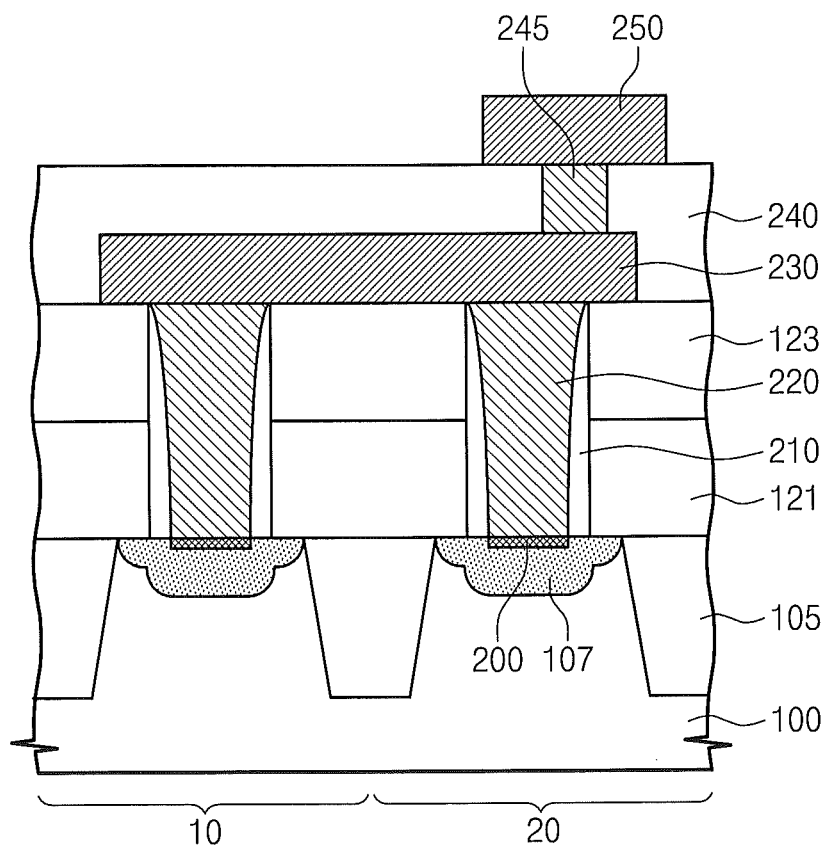

Referring to FIGS. 15A, 15B, and 15C, conductive pads 230 may be formed on the contact plugs 220, respectively. For example, the conductive pads 230 may include at least one of a metal (e.g., tungsten or aluminum), a conductive metal nitride (e.g., titanium nitride or tantalum nitride, or tungsten nitride), and a transition metal (e.g., titanium or tantalum).

In some embodiments, forming the conductive pads 230 may include forming a first connection pad ICP1 and a second connection pad ICP2. The first connection pad ICP1 electrically connects the first N-type node plug NSC1 and the first P-type node plug PSC1 to each other. The second connection pad ICP2 electrically connects the second N-type node plug NSC2 and the second P-type node plug PSC2 to each other.

A third interlayer insulating layer 240 may be formed on the second interlayer insulating layer 123 on which the conductive pads 230 are formed. A first local interconnection IP1 (250) and a second local interconnection IP2 (250) may be formed on the third interlayer insulating layer 240. The first local interconnection IP1 (250) connects the first shared gate electrode SG1 to the drains of the second pull-up and pull-down transistors PU2 and PD2 of FIG. 9, and the second local interconnection IP2 (250) connects the second shared gate electrode SG2 to the drains of the first pull-up and pull-down transistors PU1 and PD1 of FIG. 9. In more detail, the first local interconnection IP1 (250) may be electrically connected to the first connection pad ICP1 and the second shared gate electrode SG2 through upper contact plugs 245. The second local interconnection IP2 (250) may be electrically connected to the second connection pad ICP2 and the first shared gate electrode SG1 through upper contact plugs 245.

The local interconnections 250 may include at least one of a metal (e.g., tungsten or aluminum), a conductive metal nitride (e.g., titanium nitride or tantalum nitride, or tungsten nitride), and a transition metal (e.g., titanium or tantalum).

Figure 16:
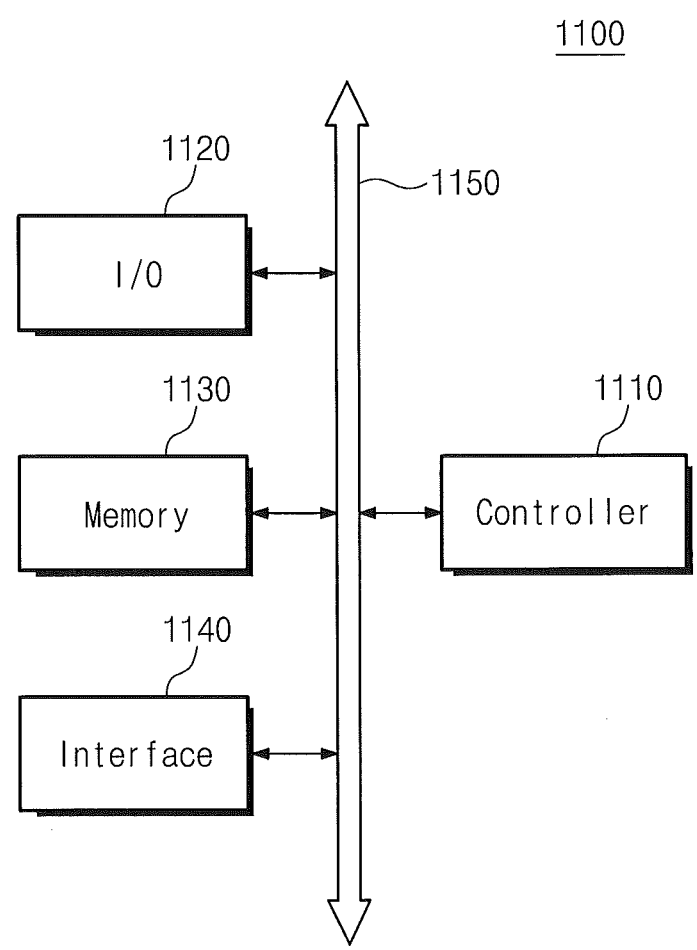
FIG. 16 is a schematic block diagram illustrating an example of electronic systems including semiconductor devices formed in some embodiments according to the inventive concept.

FIG. 16 is a schematic block diagram illustrating an example of electronic systems including semiconductor devices formed using a manufacturing method according to some embodiments of the inventive concept.

Referring to FIG. 16, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor devices according to the embodiments described above. The memory device 1130 may further include at least one of other types of semiconductor memory devices (e.g. a magnetic memory device, a phase change memory device, etc), a dynamic random access memory (DRAM) device and/or a static random access memory (SRAM) device). The interface unit 1140 may transmit data to a communication network or may receive data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data wirelessly.

Figure 17:
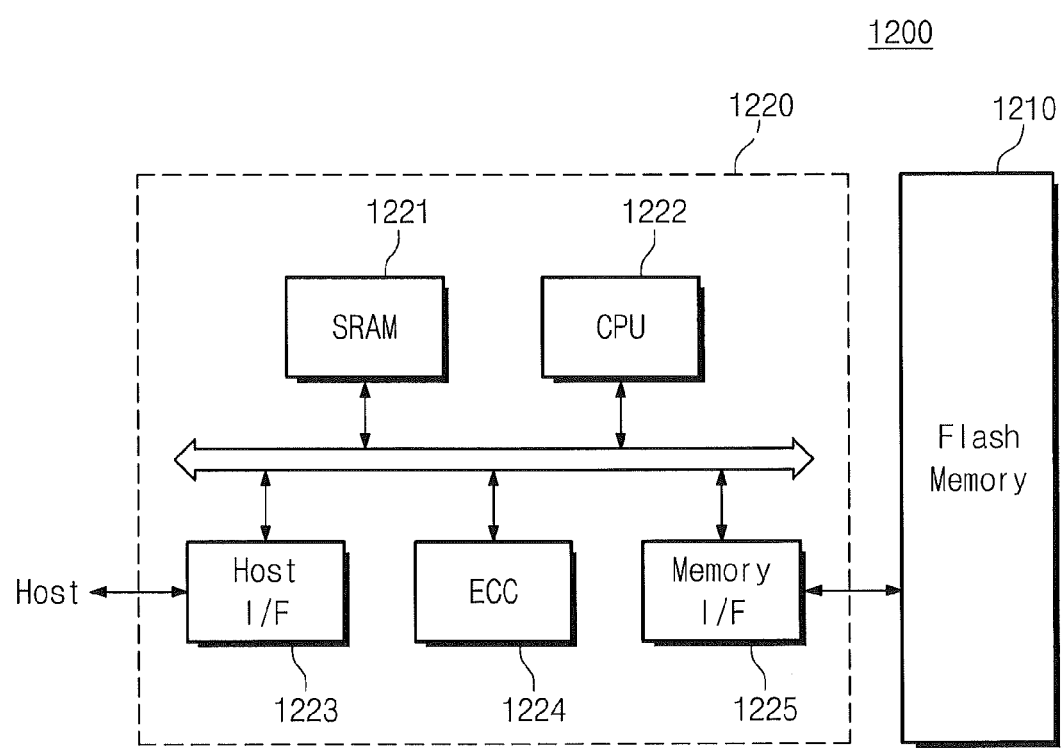
FIG. 17 is a schematic block diagram illustrating an example of memory cards including semiconductor devices formed in some embodiments according to the inventive concept.

FIG. 17 is a schematic block diagram illustrating an example of memory cards including semiconductor devices formed using a manufacturing method according to some embodiments of the inventive concept.

Referring to FIG. 17, a memory card 1200 for storing mass data may include a flash memory device 1210. The flash memory device 1210 may include a flash memory device applied with the technique of the semiconductor device according to embodiments of the inventive concept. The memory card 1200 may include a memory controller 1220 that controls data communication between a host and the flash memory device 1210.

An SRAM device 1221 may be used as an operational memory of a central processing unit (CPU) 1222. A host interface unit 1223 may be configured to include a data communication protocol between the memory card 1200 and a host. An error checking and correction (ECC) block 1224 may detect and correct some errors in data which are read out from the flash memory device 1210. A memory interface unit 1225 may interface with the flash memory device 1210. The CPU 1222 may control overall operations for data exchange of the memory controller 1220. The memory card 1200 may further include a read only memory (ROM) device that stores code data to interface with the host.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of forming a semiconductor device, the method comprising:
    forming a mask pattern including non-metallic first spaced-apart portions that extend in a first direction on a lower target layer and non-metallic second spaced-apart portions that extend in a second direction on the lower target layer to cross-over the non-metallic first spaced-apart portions at locations,
    wherein forming the mask pattern comprises:
        forming a first hard mask layer on the lower target layer, forming the first hard mask layer comprising forming an organic mask layer and forming an inorganic mask layer on the organic mask layer;
        forming a non-metallic buffer pattern on the first hard mask layer, the non-metallic buffer pattern extending in the second direction;
        forming a hard mask pattern extending in the first direction on the first hard mask layer and on the non-metallic buffer pattern;
        etching the first hard mask layer using the hard mask pattern as an etching mask to remove portions of the inorganic mask layer exposed by the hard mask pattern thereby exposing the organic mask later and to leave an inorganic mask pattern beneath the non-metallic buffer pattern and beneath the hard mask pattern; and
        removing the hard mask pattern from the non-metallic buffer pattern and from the inorganic mask pattern; and
    etching the lower target layer using the mask pattern.

2. The method of claim 1 wherein etching the lower target layer further comprises:
    removing upper portions of the non-metallic second spaced-apart portions of the mask pattern when etching the lower target layer.

3. The method of claim 1 wherein the non-metallic first and second spaced-apart portions are free of metals.

4. The method of claim 1 wherein the non-metallic first and second spaced-apart portions comprise respective non-metallic first and second spaced-apart line-shaped portions.

5. The method of claim 1 wherein forming the hard mask pattern comprises forming the hard mask pattern to include portions covering an isolation region beneath the lower target layer and extending between directly adjacent portions of the non-metallic buffer pattern.

6. The method of claim 1 wherein the first hard mask layer and the non-metallic buffer pattern have an etch selectivity relative to the hard mask pattern.

7. The method of claim 1, wherein forming the mask pattern further comprises
    etching exposed portions of the organic mask layer using the non-metallic buffer pattern and the inorganic mask pattern as an etching mask to expose underlying portions of the lower target layer and to form the non-metallic first and second spaced-apart portions of the mask pattern.

8. The method of claim 7 wherein the second spaced-apart portions of the mask pattern comprise the non-metallic buffer pattern.

9. The method of claim 7 wherein etching the lower target layer comprises anisotropically etching the lower target layer using the inorganic mask pattern, the underlying organic mask layer, and the non-metallic buffer pattern.

10. The method of claim 9 further comprising:
removing the mask pattern from the lower target layer.

11. The method of claim 10 further comprising:
forming filling material on the exposed portions of the lower target layer.

12. The method of claim 1 wherein the non-metallic first spaced-apart portions are spaced-apart by a first distance and the non-metallic second spaced-apart portions are spaced-apart by a second distance that is different than the first distance.

13. The method of claim 12 wherein the second distance varies across the lower target layer.

14. The method of claim 1 wherein the non-metallic first spaced-apart portions are spaced-apart by a first distance and the non-metallic second spaced-apart portions are spaced-apart by a second distance that is equal to the first distance.

15. The method of claim 1 wherein the semiconductor device comprises a Static Random Access Memory (SRAM).

16. The method of claim 1 further comprising:
forming gate electrodes prior to forming the mask pattern, wherein etching the lower target layer exposes active areas beneath the lower target layer associated with the gate electrodes.

17. The method of claim 1 wherein the non-metallic first spaced-apart portions and the non-metallic second spaced-apart portions comprise non-metallic first spaced-apart lines and non-metallic second spaced-apart lines, respectively, that extend in the first and second directions, perpendicular to one another.

18. The method of claim 1, wherein the mask pattern includes first and second openings defined by the non-metallic first spaced-apart portions and the non-metallic second spaced-apart portions, and
wherein the first openings have a different width compared to that of the second openings, in the first direction.

19. A method of forming a semiconductor device, the method comprising:
etching a lower target layer, using a multi-level mask mesh pattern that is free of metals, to expose active areas of a substrate adjacent to metal gate structures associated with the active areas, wherein the multi-level mask mesh pattern comprises a first mask pattern and a second mask pattern that are sequentially stacked on the lower target layer,
wherein the first mask pattern has a mesh shape and comprises first spaced-apart portions that extend in a first direction and second spaced-apart portions that extend in a second direction that is different from the first direction,
wherein the first mask pattern comprises a first organic mask pattern and a first inorganic mask pattern that are sequentially stacked on the lower target layer, and each of the first organic mask pattern and the first inorganic mask pattern has the mesh shape, and
wherein the second mask pattern comprises line-shaped second inorganic mask patterns that are spaced-apart from each other, overlie respective ones of the second spaced-apart portions of the first mask pattern and extend in the second direction.

20. The method of claim 19 wherein the first organic pattern and the first inorganic mask pattern have a high etch selectivity relative to the metal gate structures.

21. The method of claim 19 further comprising:
removing the multi-level mask mesh pattern when etching the lower target layer.

22. The method of claim 19 wherein the first spaced-apart portions are spaced apart by a first amount, and the second spaced-apart portions are spaced apart by a second amount that is different from the first amount.

23. The method of claim 19 wherein the first spaced-part portions are spaced apart by a first amount, and the second spaced-apart portions are spaced apart by the first amount.

24. The method of claim 19 wherein the line-shaped second inorganic mask patterns cross over the first spaced-apart portions of the first mask pattern.

25. The method of claim 19, wherein the first organic mask pattern has a planar upper surface.

26. The method of claim 25, wherein the first inorganic mask pattern has a unitary structure.

27. The method of claim 19, further comprising forming the multi-level mask mesh pattern on the lower target layer, wherein forming the multi-level mask mesh pattern comprises:
sequentially forming an organic mask layer, an inorganic mask layer and the line-shaped second inorganic mask patterns on the lower target layer;
forming line-shaped mask patterns on the line-shaped second inorganic mask patterns, wherein the line-shaped mask patterns are spaced apart from each other and extend in the first direction to cross over the line-shaped second inorganic mask patterns; and
forming the first inorganic pattern by etching the inorganic mask layer using the line-shaped second inorganic mask patterns and the line-shaped mask patterns as an etching mask until the organic mask layer is exposed, wherein the line-shaped second inorganic mask patterns have etch selectivity relative to the first inorganic pattern.

28. A method of forming a semiconductor device, comprising:
forming a gate structure comprising a metal in a dielectric, layer on a substrate, the gate structure associated with a target structure in the substrate;
forming a non-metallic mask pattern on the dielectric layer; and
etching the dielectric layer using the non-metallic mask pattern to expose the target structure, wherein the non-metallic mask pattern has a mesh shape,
wherein the non-metallic mask pattern comprises an organic mask pattern and an inorganic mask pattern that are sequentially stacked on the dielectric layer, and each of the organic mask pattern and the inorganic mask pattern has a mesh shape,
wherein the inorganic mask pattern has a unitary structure wherein the inorganic mask pattern comprises a first inorganic mask pattern, wherein the first inorganic mask pattern comprises non-metallic first spaced apart portions that extend in a first direction and non-metallic second spaced-apart portions that extend in a second direction that is different from the first direction, and
wherein the non-metallic mask pattern further comprises line-shaped second inorganic mask patterns on the first inorganic mask pattern, the line-shaped second inorganic mask patterns are spaced apart from each other, overlie respective ones of the non-metallic second spaced apart portions of the first inorganic mask pattern and extend in the second direction.

29. The method of claim 28 wherein the non-metallic mask pattern has relatively high etch selectivity relative to the metal.

30. The method of claim 28 wherein the non-metallic mask pattern has relatively low etch selectivity relative to the dielectric layer.

31. The method of claim 28 wherein etching the dielectric, layer comprises:
removing the non-metallic mask pattern while etching the dielectric layer.

32. The method of claim 28, wherein forming the non-metallic mask pattern comprises:
sequentially forming an organic mask layer, an inorganic mask layer and the line-shaped second inorganic mask patterns on the dielectric layer;
forming line-shaped mask patterns on the line-shaped second inorganic mask patterns, wherein the line-shaped mask patterns are spaced apart from each other and extend in the first direction to cross over the line-shaped second inorganic mask patterns; and
forming the first inorganic pattern by etching the inorganic mask layer using the line-shaped second inorganic mask patterns and the line-shaped mask patterns as an etching mask until the organic mask layer is exposed.

33. The method of claim 32, wherein forming the non-metallic mask pattern further comprises:
removing the line-shaped mask patterns; and
forming the organic mask pattern by etching the organic mask layer using the first inorganic mask pattern and the line-shaped second inorganic mask patterns as an etching mask.

* * * * *